US012573596B2

(12) United States Patent
Motokawa et al.

(10) Patent No.: US 12,573,596 B2
(45) Date of Patent: Mar. 10, 2026

(54) PLASMA TREATMENT APPARATUS, PLASMA TREATMENT METHOD, AND ORIGINAL PLATE MANUFACTURING METHOD

(71) Applicant: KIOXIA CORPORATION, Tokyo (JP)

(72) Inventors: Takeharu Motokawa, Zushi Kanagawa (JP); Noriko Sakurai, Yokohama Kanagawa (JP); Hideaki Sakurai, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 640 days.

(21) Appl. No.: 17/902,745

(22) Filed: Sep. 2, 2022

(65) Prior Publication Data

US 2023/0290619 A1 Sep. 14, 2023

(30) Foreign Application Priority Data

Mar. 11, 2022 (JP) ................................. 2022-038213

(51) Int. Cl.
*H01J 37/32* (2006.01)

(52) U.S. Cl.
CPC .. *H01J 37/32669* (2013.01); *H01J 37/32522* (2013.01); *H01J 37/32532* (2013.01)

(58) Field of Classification Search
CPC ........... H01J 37/32669; H01J 37/32522; H01J 37/32532
See application file for complete search history.

(56) References Cited

U.S. PATENT DOCUMENTS

| | | | |
|---|---|---|---|
| 6,503,367 B1 | 1/2003 | Loewenhardt | |
| 6,716,540 B2 | 4/2004 | Kohara et al. | |
| 10,221,480 B2 | 3/2019 | Kato | |
| 2004/0121610 A1 | 6/2004 | Russell | |
| 2005/0028935 A1* | 2/2005 | Wickramanayaka | ........................ H01J 37/3244 156/345.34 |
| 2013/0088809 A1* | 4/2013 | Parkhe | ................... H02N 13/00 165/185 |

(Continued)

FOREIGN PATENT DOCUMENTS

| | | |
|---|---|---|
| JP | 2001291704 A | 10/2001 |
| JP | 2002256415 A | 9/2002 |

(Continued)

OTHER PUBLICATIONS

Min Zhong et al., "Effect of substrate morphology on the roughness evolution of ultra thin DLC films", Applied Surface Science 254, 2008, pp. 6742-6748. Retrieved from: http://dx.doi.org/10.1016/j.apsusc.2008.04.059.

(Continued)

*Primary Examiner* — Yuechuan Yu
(74) *Attorney, Agent, or Firm* — Kim & Stewart LLP

(57) ABSTRACT

According to one embodiment, a plasma treatment apparatus includes a first chamber, an electrode provided in the first chamber and having a surface, and a conveyance mechanism that places a carrier structure holding a treatment target in the first chamber such that a ferromagnetic body of the carrier structure is disposed between the surface of the electrode and the treatment target. The ferromagnetic body has a single polarity within a plane substantially parallel to the surface of the electrode.

17 Claims, 23 Drawing Sheets

(56)          References Cited

U.S. PATENT DOCUMENTS

| | | |
|---|---|---|
| 2018/0061619 A1 | 3/2018 | Matsuura |
| 2021/0291408 A1 | 9/2021 | Motokawa et al. |
| 2022/0291581 A1 | 9/2022 | Motokawa et al. |

FOREIGN PATENT DOCUMENTS

| | | | |
|---|---|---|---|
| JP | 2004238696 A | 8/2004 | |
| JP | 2007162045 A | 6/2007 | |
| JP | 2012062573 A | 3/2012 | |
| JP | 2013049885 A | 3/2013 | |
| JP | 2020503663 A | 1/2020 | |
| JP | 2021150482 A | 9/2021 | |
| JP | 2022140088 A | 9/2022 | |
| TW | 303480 B | 4/1997 | |
| TW | 200425312 A | 11/2004 | |
| TW | 201718931 A | 6/2017 | |
| TW | 201820462 A | 6/2018 | |
| WO | WO-2014064860 A1 * | 5/2014 | ....... H01L 21/68714 |
| WO | 2021188122 A1 | 9/2021 | |

OTHER PUBLICATIONS

Japanese Office Action dated May 13, 2025, mailed in counterpart Japanese Application No. 2022-038213, 8 pages.

\* cited by examiner

PLASMA TREATMENT APPARATUS, PLASMA TREATMENT METHOD, AND ORIGINAL PLATE MANUFACTURING METHOD

CROSS-REFERENCE TO RELATED APPLICATIONS

This application is based upon and claims the benefit of priority from Japanese Patent Application No. 2022-038213, filed Mar. 11, 2022, the entire contents of which are incorporated herein by reference.

FIELD

Embodiments described herein relate generally to a plasma treatment apparatus, a plasma treatment method, and an original plate manufacturing method.

BACKGROUND

In recent years, a technology for treating a surface of a target by using a plasma treatment apparatus such as a magnetron sputtering apparatus or a plasma chemical vapor deposition apparatus (plasma CVD apparatus) has been developed.

BRIEF DESCRIPTION OF THE DRAWINGS

FIG. 1 is a block diagram showing a configuration example of a plasma treatment apparatus of a first embodiment.

FIG. 36 is a schematic cross-sectional view illustrating a modification example of the plasma treatment step.

FIG. 37 is a schematic cross-sectional view illustrating a modification example of the plasma treatment step.

DETAILED DESCRIPTION

Figure 2:
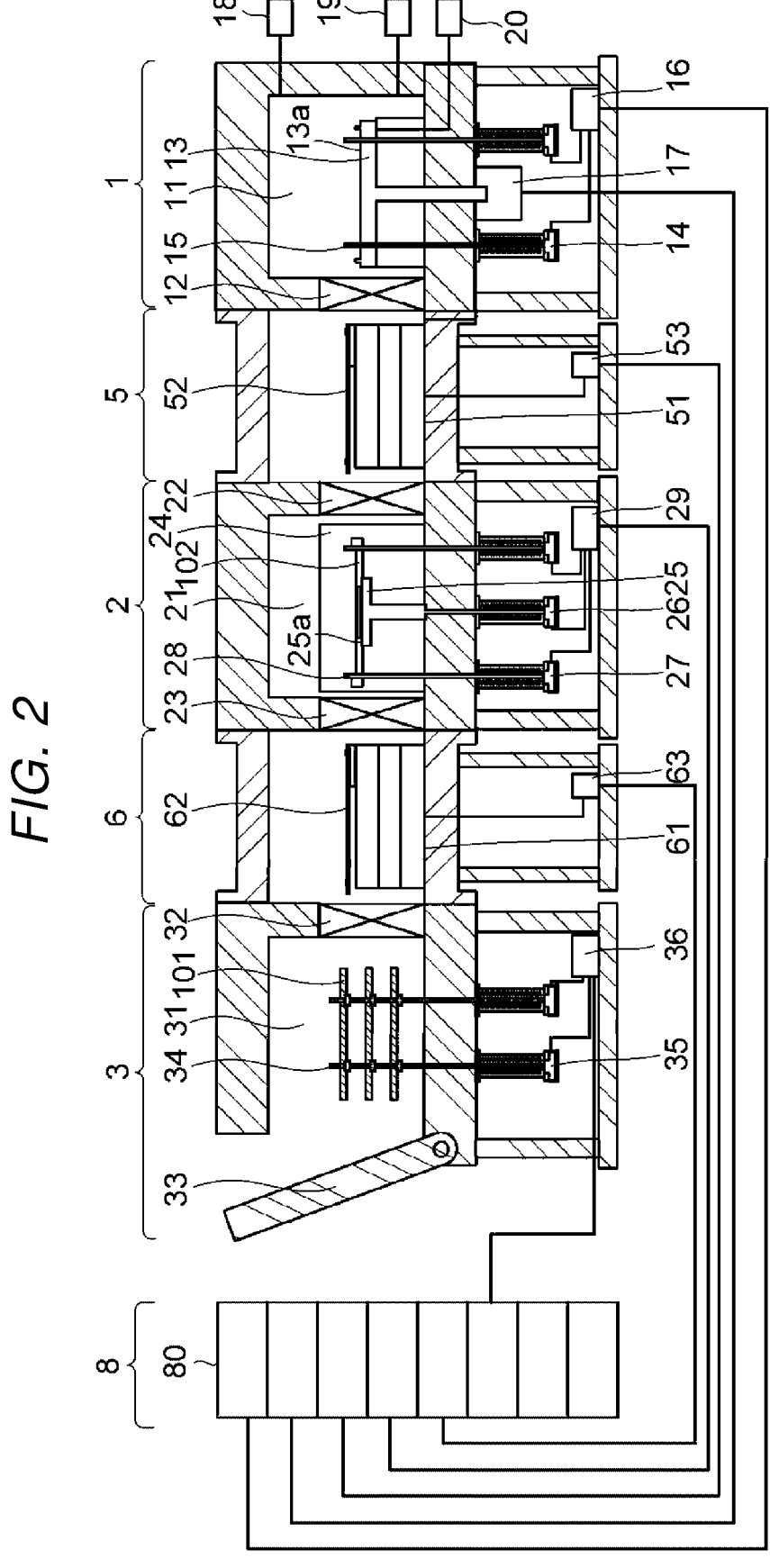
FIG. 2 is a schematic cross-sectional view showing a configuration example of the plasma treatment apparatus of a first embodiment.

Embodiments reduce the roughness of the surface of a treatment target.

In general, according to one embodiment, a plasma treatment apparatus includes a first chamber, an electrode in the first chamber, and a conveyance mechanism. The conveyance mechanism is configured to place a carrier structure that is holding a treatment target into the first chamber. The carrier structure includes a ferromagnetic body that is positioned between the electrode and the treatment target when the carrier structure is placed in the first chamber. The ferromagnetic body has a single polarity within a plane substantially parallel to a surface of the electrode when the carrier structure is placed in the first chamber for a plasma treatment process.

Hereinafter, certain example embodiments will be described with reference to the drawings. The depicted relationships between the thicknesses and planar dimensions of each component shown in the drawings, the ratio of the dimensions of each component, and the like may differ from the actual relationships, ratios, and the like. Further, in the embodiments, components that are substantially the same are given the same reference numerals, and the description thereof will be omitted from subsequently described embodiments as appropriate.

First Embodiment

In this first embodiment, an example of a plasma treatment apparatus and a plasma treatment method will be described.

Plasma Treatment Apparatus

Figure 1:
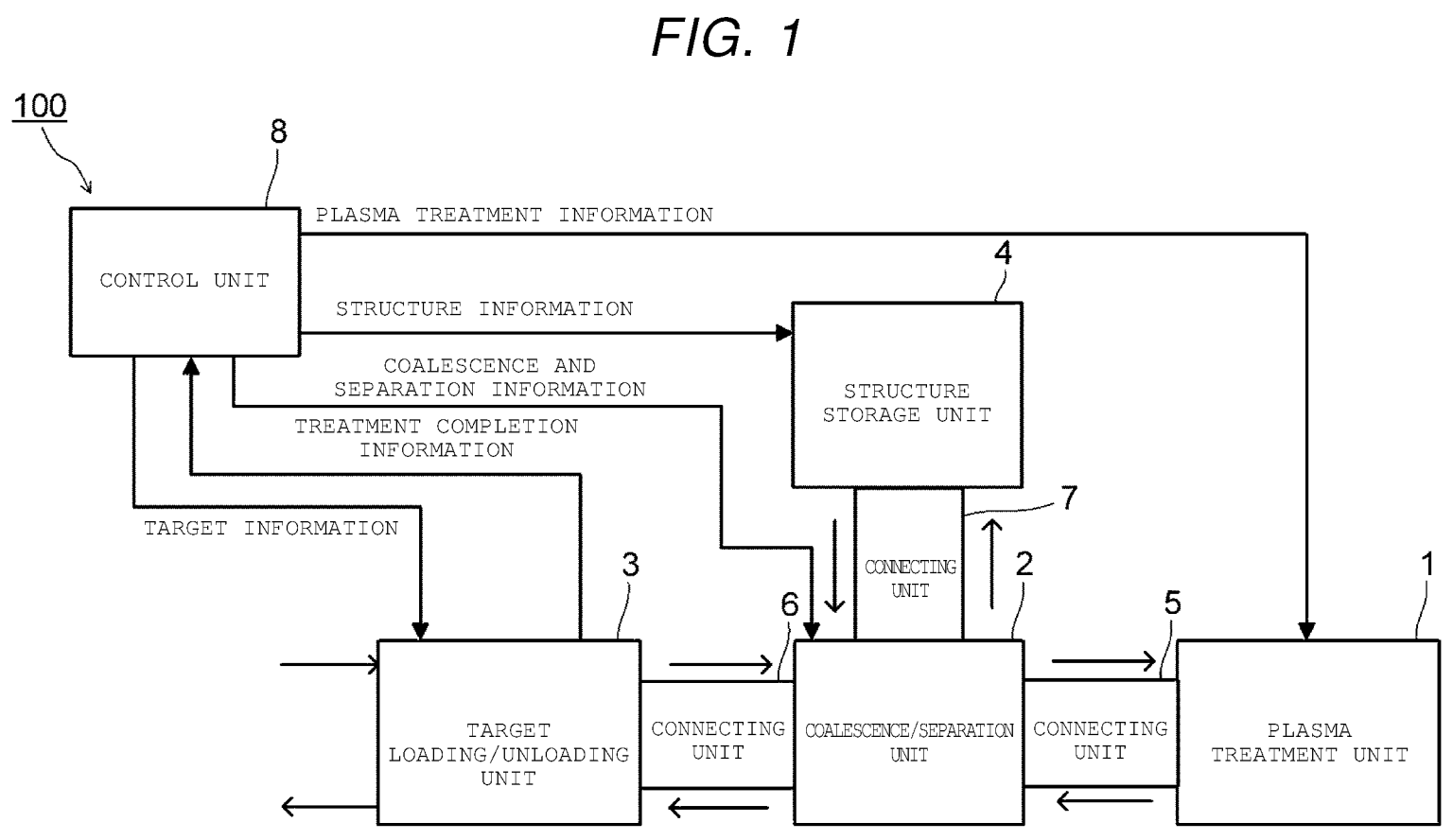

FIG. 1 is a block diagram showing a configuration example of the plasma treatment apparatus of a first embodiment. FIG. 2 is a schematic cross-sectional view showing a configuration example of the plasma treatment apparatus of the first embodiment. Here, an example of a plasma CVD apparatus is shown, but the present disclosure is not limited thereto, and a sputtering apparatus or the like may be used in other examples.

A plasma treatment apparatus 100 includes a plasma treatment unit 1, a coalescence/separation unit 2, a target loading/unloading unit 3, a structure storage unit 4, a connecting unit 5, a connecting unit 6, a connecting unit 7, and a control unit 8.

Plasma Treatment Unit 1

The plasma treatment unit 1 can perform plasma treatment on a treatment target 101. As shown in FIG. 2, the plasma treatment unit 1 includes a chamber 11, a loading/unloading door 12, an electrode 13, an elevation driving mechanism 14, a lift 15, an elevation controller 16, a voltage controller 17, a gas introduction mechanism 18, a gas discharge mechanism 19, and a temperature control mechanism 20.

The chamber 11 is a space where plasma treatment is performed.

The loading/unloading door 12 connects or disconnects the chamber 11 and the connecting unit 5 by opening and closing.

The electrode 13 is provided in the chamber 11. The electrode 13 has a surface 13a on which a coalesced product of the treatment target 101 and a structure 102 is placed. The electrode 13 can generate plasma, according to the applied voltage, from the raw material gas introduced into the chamber 11. The voltage of the electrode 13 changes, for example, by alternately applying a positive DC voltage and a negative DC voltage.

The elevation driving mechanism 14 can raise and lower the coalesced product of the treatment target 101 and the structure 102 by using the lift 15. The elevation driving mechanism 14 is controlled by the elevation controller 16. FIG. 2 shows two elevation driving mechanisms 14, but the number of elevation driving mechanisms 14 is not limited to the number shown in FIG. 2.

The voltage controller 17 has a function of applying a voltage to the electrode 13. The voltage controller 17 includes, for example, a positive DC power source, a negative DC power source, and a power source controller that controls the timing of applying a voltage from these DC power sources.

The gas introduction mechanism 18 can introduce the gas used for plasma treatment into the chamber 11 via a pipe. The gas introduction mechanism 18 includes, for example, a tank for accommodating gas, a pressurizing pump provided in the middle of the pipe connecting the tank and the chamber 11, and a massflow controller that is provided in the middle of the pipe connecting the tank and the chamber 11 to control the flow rate of the gas. In some examples, a pressurizing pump may be omitted if the tank and the chamber 11 are at a sufficient pressure differential to cause gas to be supplied into the chamber 11 from the tank.

Examples of the gas used for the plasma treatment include a raw material gas for performing film forming treatment on the treatment target 101. The raw material gas contains, for example, a carbon atom.

The gas discharge mechanism 19 can discharge gas from the chamber 11 via the pipe. For example, the inside of the chamber 11 may be controlled to a vacuum state by the gas discharge mechanism 19. The gas discharge mechanism 19 has, for example, a vacuum valve provided in the middle of the pipe connecting the chamber 11 and the outside of the plasma treatment apparatus 100.

The temperature control mechanism 20 can control the temperature of the electrode 13. The temperature control mechanism 20 includes, for example, a temperature sensor, and at least one of a heater for heating the electrode 13 and a cooler for cooling the electrode 13.

Coalescence/Separation Unit 2

The coalescence/separation unit 2 can be used to combine (join) the treatment target 101 and the structure 102, and can also be used to separate the treatment target 101 and the structure 102. As shown in FIG. 2, the coalescence/separation unit 2 includes a chamber 21, a loading/unloading door 22, a loading/unloading door 23, a loading/unloading door 24, a stage 25, an elevation driving mechanism 26, an elevation driving mechanism 27, a lift 28, and an elevation controller 29.

The chamber 21 is a space in which the treatment target 101 and the structure 102 are coalesced or separated.

The loading/unloading door 22 connects or disconnects the chamber 21 and the connecting unit 5 by opening and closing.

The loading/unloading door 23 connects or disconnects the chamber 21 and the connecting unit 6 by opening and closing.

The loading/unloading door 24 connects or disconnects the chamber 21 and the connecting unit 7 by opening and closing.

The stage 25 is provided in the chamber 21. The stage 25 includes the treatment target 101, the structure 102, and a surface 25a on which coalescence and separation of the treatment target 101 and the structure 102 is performed.

The elevation driving mechanism 26 can raise and lower the stage 25. The elevation driving mechanism 26 is controlled by the elevation controller 29.

The elevation driving mechanism 27 can raise and lower the treatment target 101 and the structure 102 by using the lift 28. The elevation driving mechanism 27 is controlled by the elevation controller 29. FIG. 2 shows two elevation driving mechanisms 27, but the number of elevation driving mechanisms 27 is not limited to the number shown in FIG. 2.

Target Loading/Unloading Unit 3

The target loading/unloading unit 3 can load/unload the treatment target 101. As shown in FIG. 2, the target loading/unloading unit 3 includes a chamber 31, a loading/unloading door 32, a loading/unloading door 33, a cassette 34, an elevation driving mechanism 35, and an elevation controller 36.

The chamber 31 is a space in which the treatment target 101 is stored.

The loading/unloading door 32 connects or disconnects the chamber 31 and the connecting unit 6 by opening and closing.

The loading/unloading door 33 connects or disconnects the chamber 31 and the outside of the plasma treatment apparatus 100 by opening and closing.

The cassette 34 can hold the treatment target 101. FIG. 2 shows an example in which the cassette 34 holds three treatment targets 101, but the number of treatment targets 101 held by the cassette 34 is not limited to the number shown in FIG. 2.

The elevation driving mechanism 35 can raise and lower the cassette 34. The elevation driving mechanism 35 is controlled by the elevation controller 36. FIG. 2 shows two elevation driving mechanisms 35, but the number of elevation driving mechanisms 35 is not limited to the number shown in FIG. 2.

Structure Storage Unit 4

The structure storage unit 4 can store the structure 102 for accommodating the treatment target 101.

Connecting Unit 5

The connecting unit 5 is provided between the plasma treatment unit 1 and the coalescence/separation unit 2. The connecting unit 5 has a conveyance mechanism including a conveyance driving mechanism 51, a robot arm 52, and a conveyance controller 53.

The conveyance driving mechanism 51 can convey the treatment target 101 and the structure 102 between the chamber 11 and the chamber 21 by using the robot arm 52. The operation of the conveyance driving mechanism 51 can be controlled by the conveyance controller 53.

Connecting Unit 6

The connecting unit 6 is provided between the coalescence/separation unit 2 and the target loading/unloading unit 3. The connecting unit 6 has a conveyance mechanism including a conveyance driving mechanism 61, a robot arm 62, and a conveyance controller 63.

The conveyance driving mechanism 61 can convey the treatment target 101 between the chamber 21 and the chamber 31 by using the robot arm 62. The operation of the conveyance driving mechanism 61 can be controlled by the conveyance controller 63.

Connecting Unit 7

The connecting unit 7 is provided between the coalescence/separation unit 2 and the structure storage unit 4. The connecting unit 7 has a conveyance mechanism including a conveyance driving mechanism, a robot arm (robot arm 72 described later), and a conveyance controller. The conveyance driving mechanism can convey the structure 102 between the chamber 21 and the structure storage unit 4 by using a robot arm. The operation of the conveyance driving mechanism can be controlled by the conveyance controller.

Control Unit 8

The control unit 8 may be implemented by a hardware 80 including, for example, a processor, a personal computer, or the like. The hardware 80 is directly connected to, for example, each of the elevation controller 16, the voltage controller 17, the elevation controller 29, the elevation controller 36, the conveyance controller 53, the conveyance controller 63, and the conveyance controller of the connecting unit 7, or is indirectly connected to each of these via a computer network, and can control each operation by communicating with each of these components. It is noted that each operation may be stored as an operation program in a non-transitory computer-readable recording medium such as a memory device, and each operation may be executed by appropriately reading the operation program stored in the recording medium by the hardware 80.

Treatment Target 101

The treatment target 101 is, for example, an original plate. The original plate is a light-transmissive substrate such as a quartz substrate, and examples thereof include a template used in a pattern forming method using nanoimprint lithography (NIL) or a photomask used in optical lithography. Examples of a template include a master template and a replica template manufactured from the master template used as a mold. Further, the treatment target 101 is not limited to an original plate such as an imprint template, and in some examples may be a semiconductor substrate on which a circuit pattern is formed such as a semiconductor wafer or a silicon wafer. Hereinafter, an example in which a replica template is used as the treatment target 101 will be described, but the present disclosure is not limited thereto.

In the pattern forming method using NIL, a template is pressed onto an imprint material layer such as an ultraviolet curable resin provided on a target, and light is emitted to cure the imprint material layer and transfer a pattern to the imprint material layer.

Figures 3, 4:
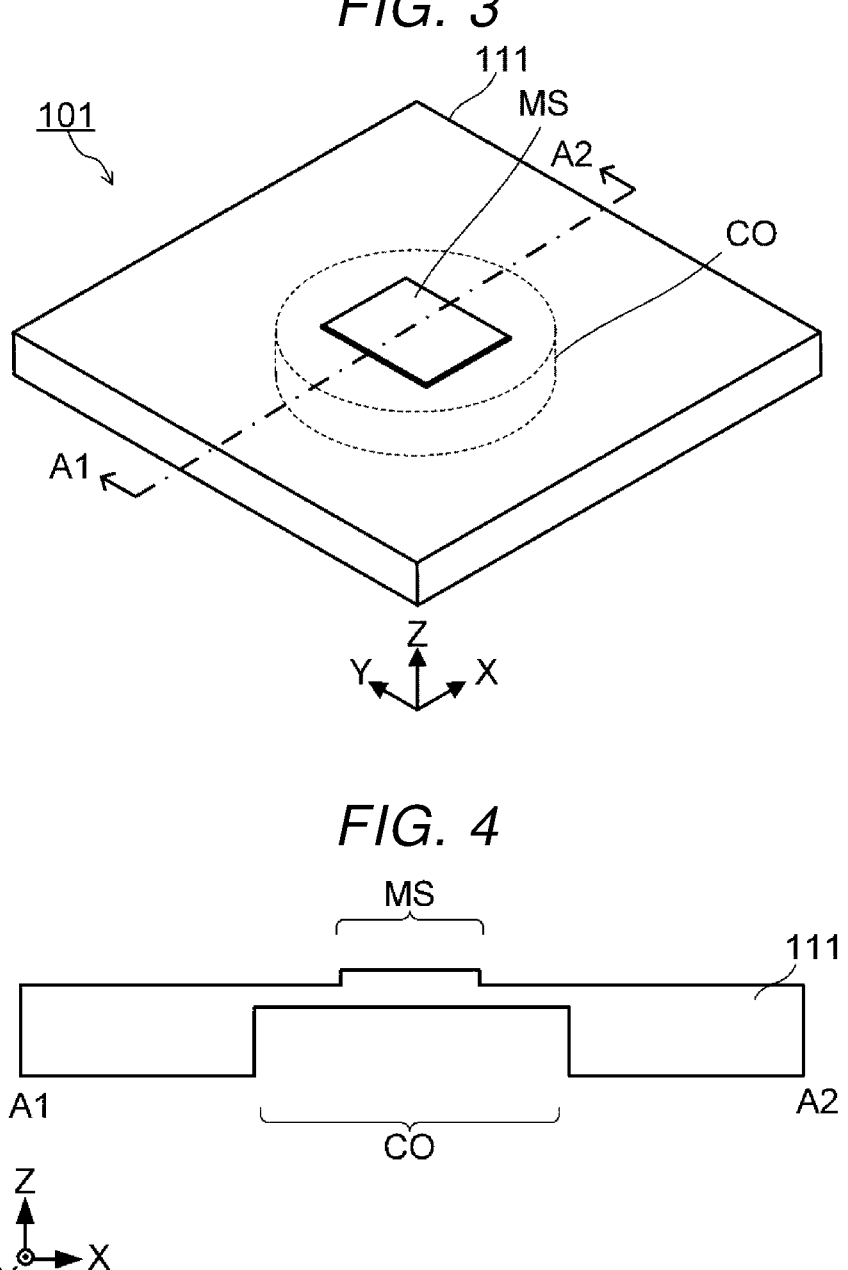
FIG. 3 is a schematic perspective view illustrating a structural example of a template.
FIG. 4 is a schematic cross-sectional view illustrating a structural example of a template.

FIG. 3 is a schematic perspective view illustrating a structural example of a template. As shown in FIG. 3, the template has a base 111 including a surface MS, called a mesa, and a groove CO. The base 111 is, for example, a quartz glass substrate. Therefore, the base 111 contains silicon and oxygen. FIG. 4 is a schematic cross-sectional view illustrating a structural example of the template, and shows a part of an X-Z cross section including an X axis and a Z axis orthogonal to the X axis and Y axis of the base 111, which is taken along line B1-B2 shown in FIG. 3.

Figures 5, 6:
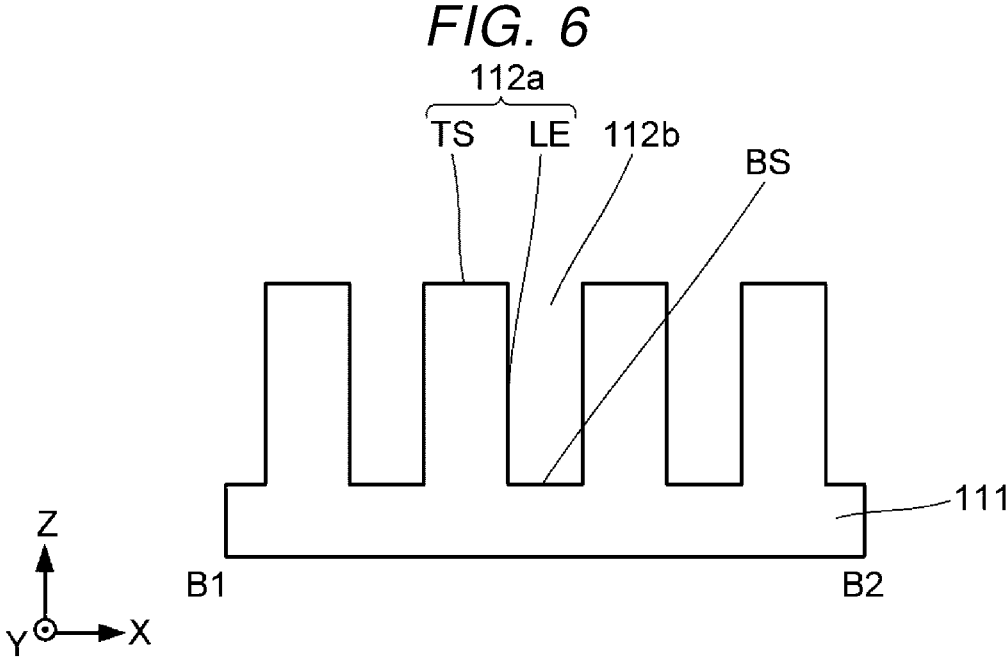
FIG. 5 is a schematic top view illustrating a layout example of a surface.
FIG. 6 is a schematic cross-sectional view illustrating a layout example of the surface.

FIG. 5 is a schematic top view illustrating a layout example of the surface MS, and shows a part of the X-Y plane of the base 111. FIG. 6 is a schematic cross-sectional view illustrating a layout example of the surface MS, and shows a part of the X-Z cross section of the base 111, which is taken along line B1-B2 shown in FIG. 5.

The surface MS includes an imprint pattern 112. The imprint pattern 112 is the pattern transferred by using NIL. The number, position, and shape of the imprint patterns 112 are not particularly limited. As an example, FIGS. 5 and 6 show the imprint pattern 112 composed of a line and space pattern including a projection portion 112a having an upper surface TS and a recess portion 112b having a lower surface BS. The imprint pattern 112 further has a side surface LE (also referred to as a line edge LE) of the projection portion 112a between the upper surface TS and the lower surface BS.

Structure 102

Figure 7:
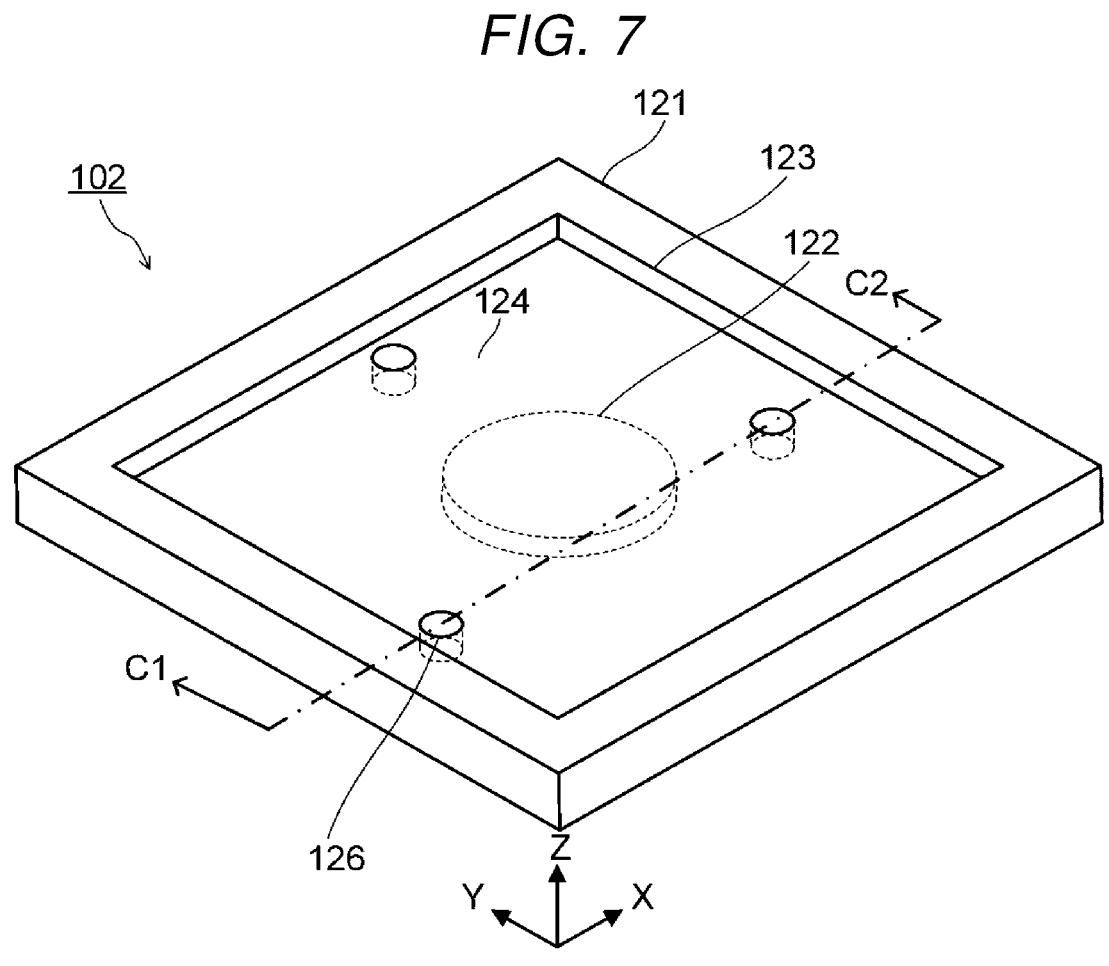
FIG. 7 is a schematic perspective view illustrating aa structure.
Figure 8:
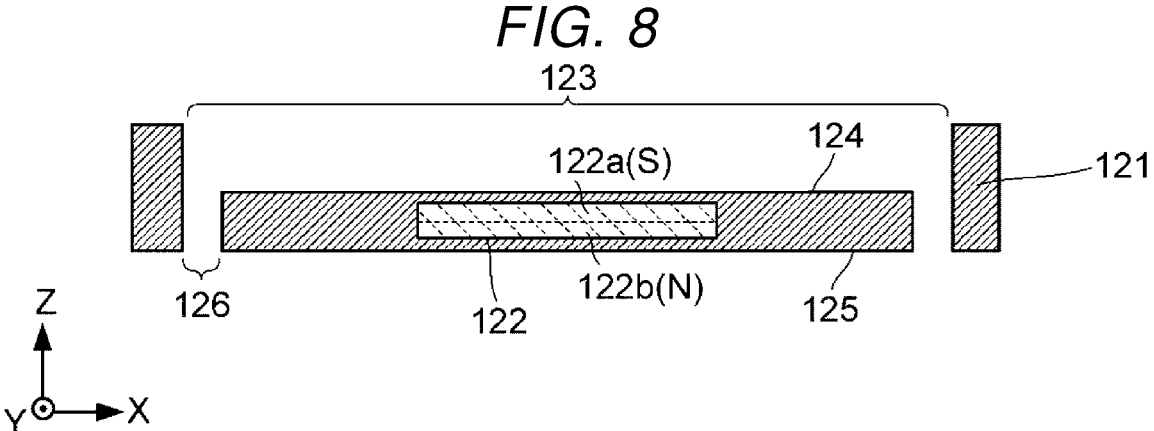
FIG. 8 is a schematic cross-sectional view illustrating a structure.

FIG. 7 is a schematic perspective view illustrating a structural example of a structure 102 (also referred to as a carrier structure 102 or template carrier 102). As shown in FIG. 7, the structure 102 includes a tray 121 and a magnetic body 122. FIG. 8 is a schematic cross-sectional view illustrating a structural example of the structure 102, and shows a part of the X-Z cross section of the tray 121, which is taken along line C1-C2 shown in FIG. 7.

The tray 121 has a recess portion 123 for accommodating the treatment target 101, a bottom surface 124 of the recess portion 123, a placement surface 125 for placement on the electrode 13 or the stage 25, and an opening 126 through which the lift 28 can pass. The tray 121 can be formed by using a resin material or plastic. The tray 121 is preferably a dielectric. Examples of the dielectric include a resin such as polyetheretherketone (PEEK). The tray 121 is preferably made of a material having high heat resistance and excellent wear resistance and dimensional stability. The number of recess portions 123 and openings 126 is not limited to the numbers shown in FIGS. 7 and 8.

The magnetic body 122 is embedded in the tray 121 and superposed on the recess portion 123 in the Z-axis direction. The magnetic body 122 has an S-pole region 122*a* facing the recess portion 123 and an N-pole region 122*b* on the opposite side of the recess portion 123. The magnetic body 122 has a single polarity in a direction parallel to the bottom surface 124 of the recess portion 123. The magnetic body 122 may be provided on the tray 121 and/or may be attachable to and detachable from the tray 121. The magnetic body 122 is, for example, a ferromagnetic body. Examples of ferromagnetic bodies include hard magnetic bodies such as permanent magnets formed using materials such as ferrite, samarium-cobalt alloys, neodymium, and iron-aluminum-silicon alloys. The number of magnetic bodies 122 is not limited to the numbers shown in FIGS. 7 and 8.

Plasma Treatment Method

Figure 9:
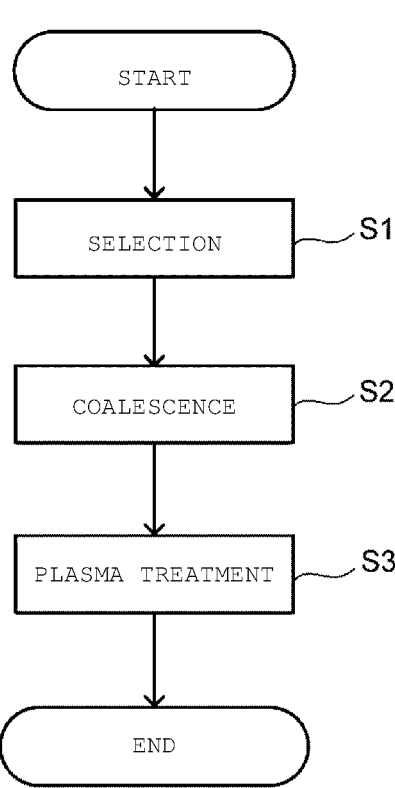
FIG. 9 is a flowchart of an example of a plasma treatment method.

FIG. 9 is a flowchart of an example of the plasma treatment method using the plasma treatment apparatus 100. As shown in FIG. 9, an example of the plasma treatment method includes a selection step S1, a coalescence step S2, and a plasma treatment step S3.

Selection Step S1

In the example of the selection step S1, the treatment target 101 in the target loading/unloading unit 3 is selected based on the target information from the control unit 8, and the structure 102 in the structure storage unit 4 is selected based on the structure information from the control unit 8. The selection of the treatment target 101 and the selection of the structure 102 may be performed simultaneously with each other or separately.

Coalescence Step S2

FIGS. 10 to 13 are schematic cross-sectional views illustrating an example of the coalescence step S2, and show a part of the X-Z cross section of the treatment target 101. In the coalescence step S2, the treatment target 101 and the structure 102 are brought together based on the coalescence information from the control unit 8.

Figure 10:
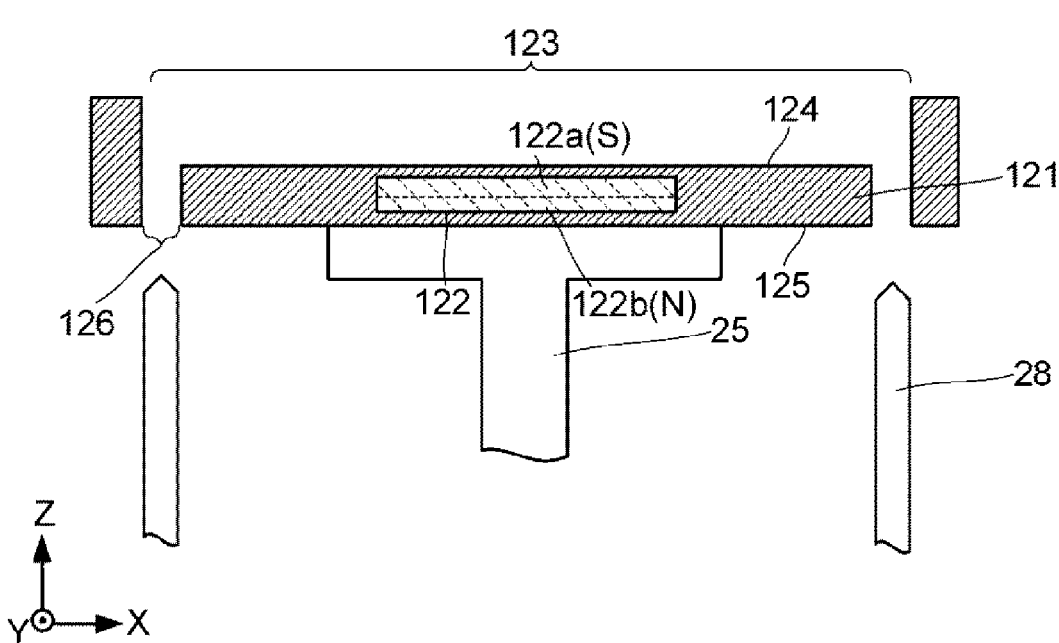
FIG. 10 is a schematic cross-sectional view illustrating an example of a coalescence step.
Figure 11:
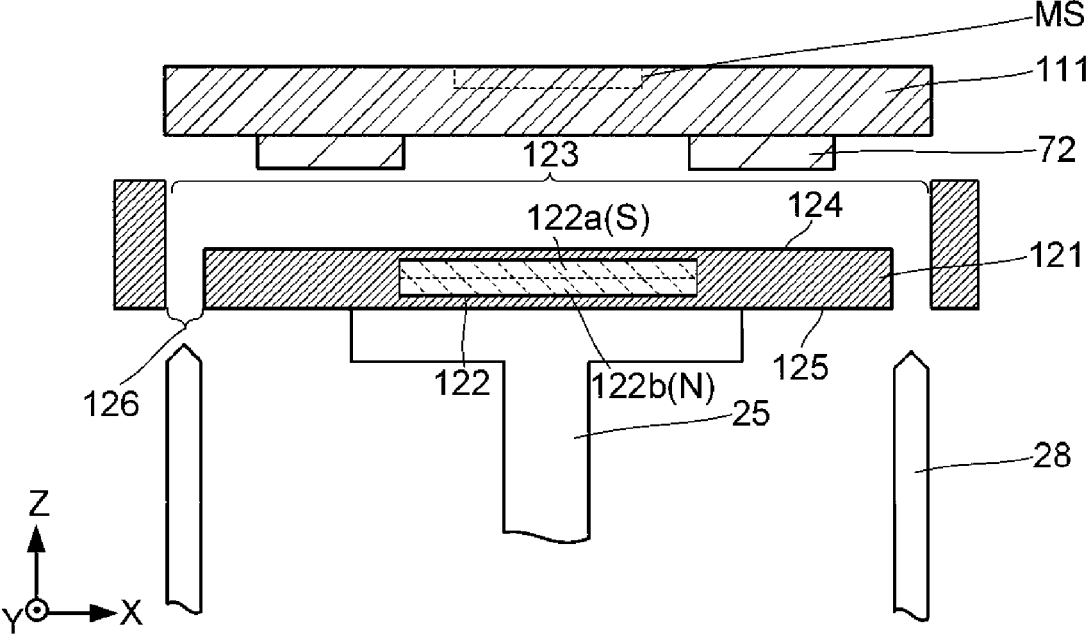
FIG. 11 is a schematic cross-sectional view illustrating an example of the coalescence step.
Figure 12:
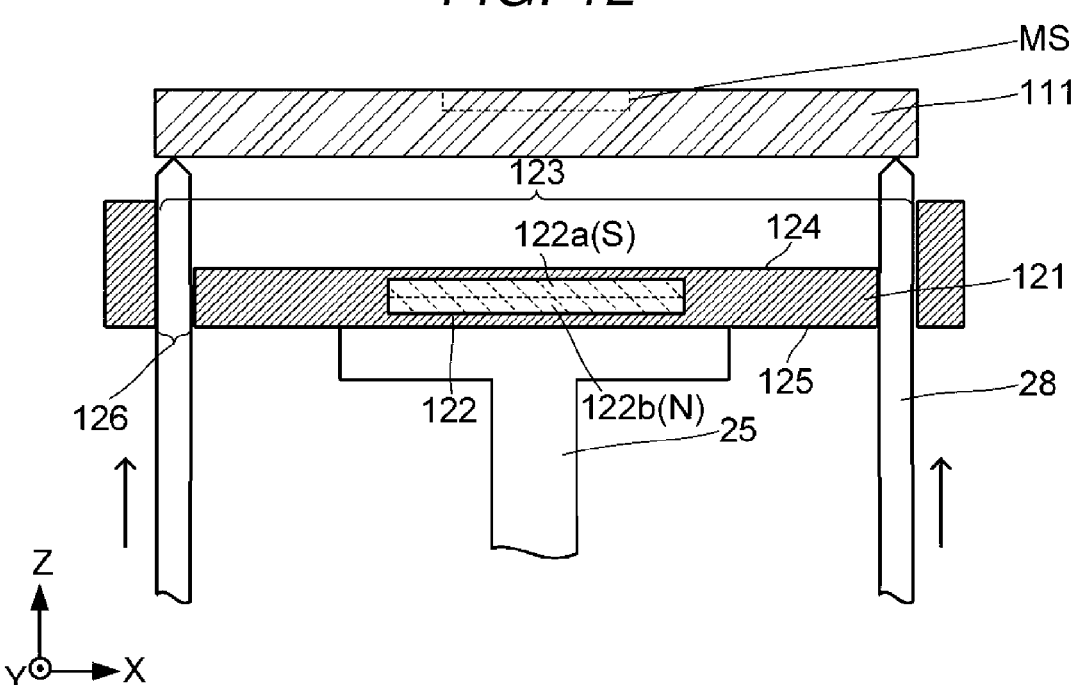
FIG. 12 is a schematic cross-sectional view illustrating an example of the coalescence step.
Figure 13:
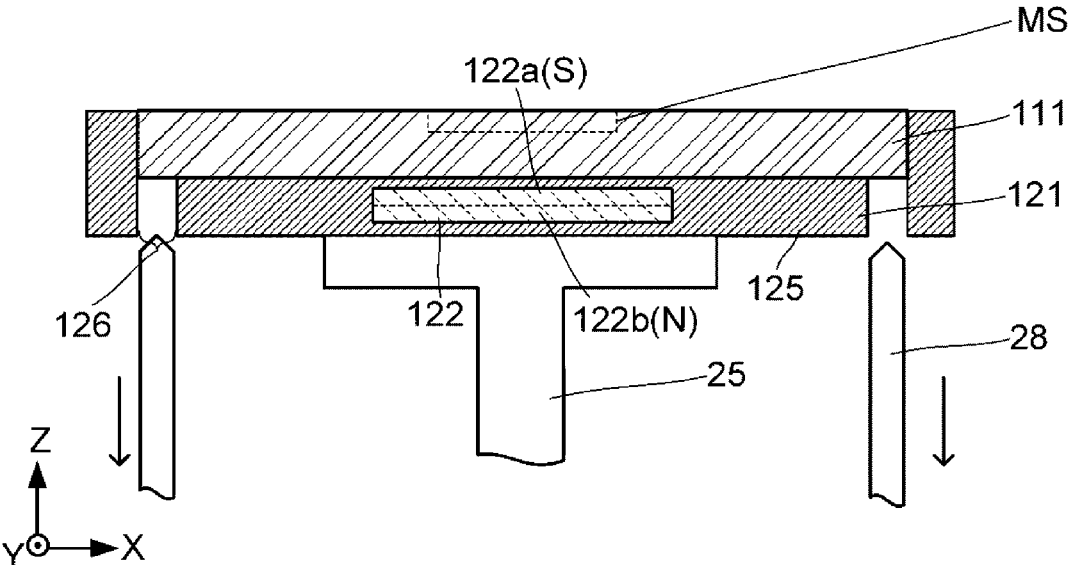
FIG. 13 is a schematic cross-sectional view illustrating an example of the coalescence step.

The coalescence step S2 is performed in the coalescence/separation unit 2 by the following steps. First, as shown in FIG. 10, the structure 102 is disposed on the stage 25 from the structure storage unit 4 via the loading/unloading door 24 by using the robot arm 72. At this time, the placement surface 125 of the structure 102 is in contact with the stage 25. Next, as shown in FIG. 11, the robot arm 72 of the connecting unit 7 is driven to place the treatment target 101 on the structure 102 from the target loading/unloading unit 3 via the loading/unloading door 23. At this time, the surface MS of the treatment target 101 is superposed on the recess portion 123 of the tray 121. In FIG. 11 (and subsequent figures), the projection shape of the surface MS and the groove CO on the treatment target 101 are omitted for clarity. Next, as shown in FIG. 12, the lift 28 is raised by the elevation driving mechanism 27, and the treatment target 101 is held by the lift 28. Next, as shown in FIG. 13, the lift

28 is lowered by the elevation driving mechanism 27, and the treatment target 101 is disposed in the recess portion 123.

Plasma Treatment Step S3

FIGS. 14 to 17 are schematic cross-sectional views illustrating an example of the plasma treatment step S3, and show a part of the X-Z cross section of the treatment target 101. In the plasma treatment step S3, plasma treatment is performed on the treatment target 101 on the structure 102 based on the plasma treatment information from the control unit 8. By the plasma treatment step S3, for example, a film 113 is formed on the base 111.

Figure 14:
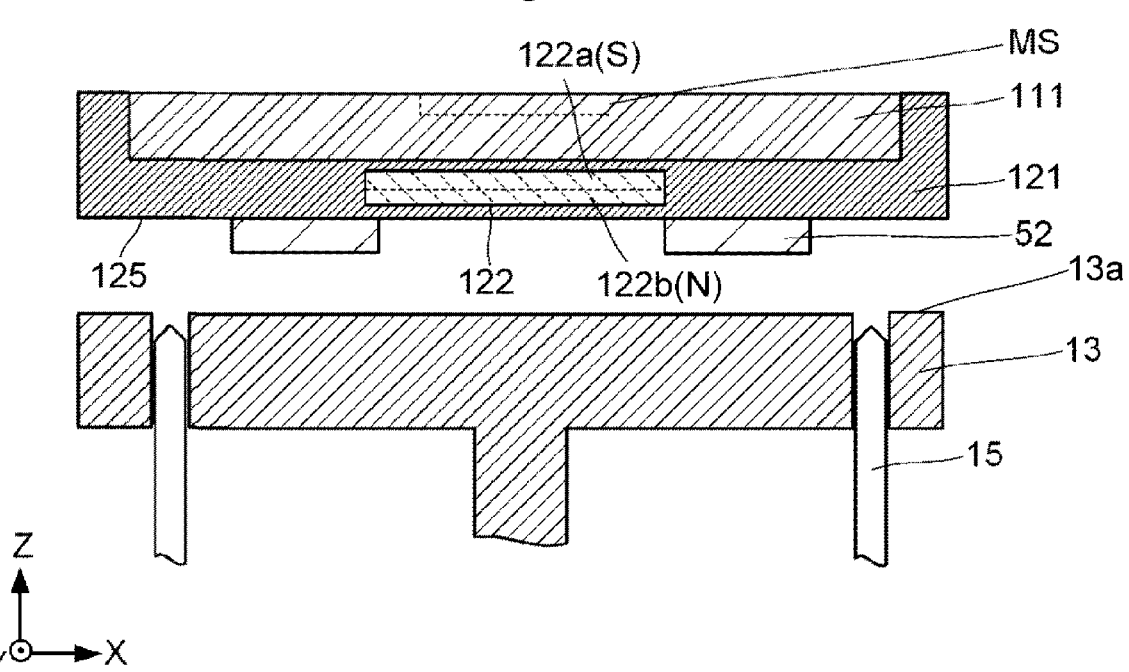
FIG. 14 is a schematic cross-sectional view illustrating an example of a plasma treatment step.
Figure 15:
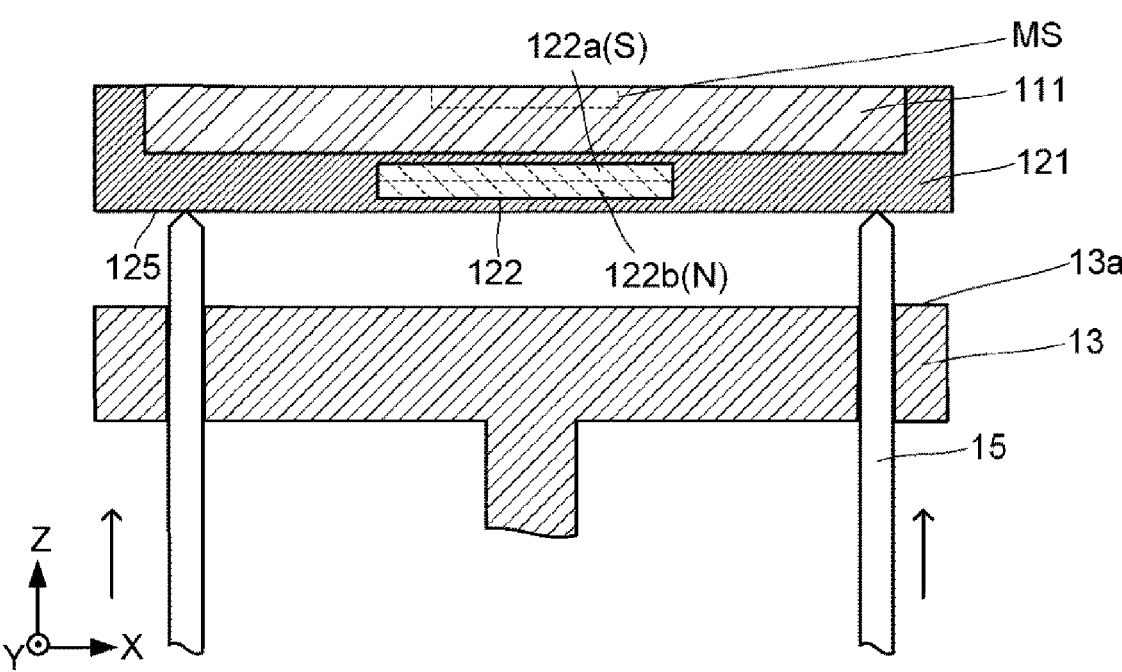
FIG. 15 is a schematic cross-sectional view illustrating an example of the plasma treatment step.
Figure 16:
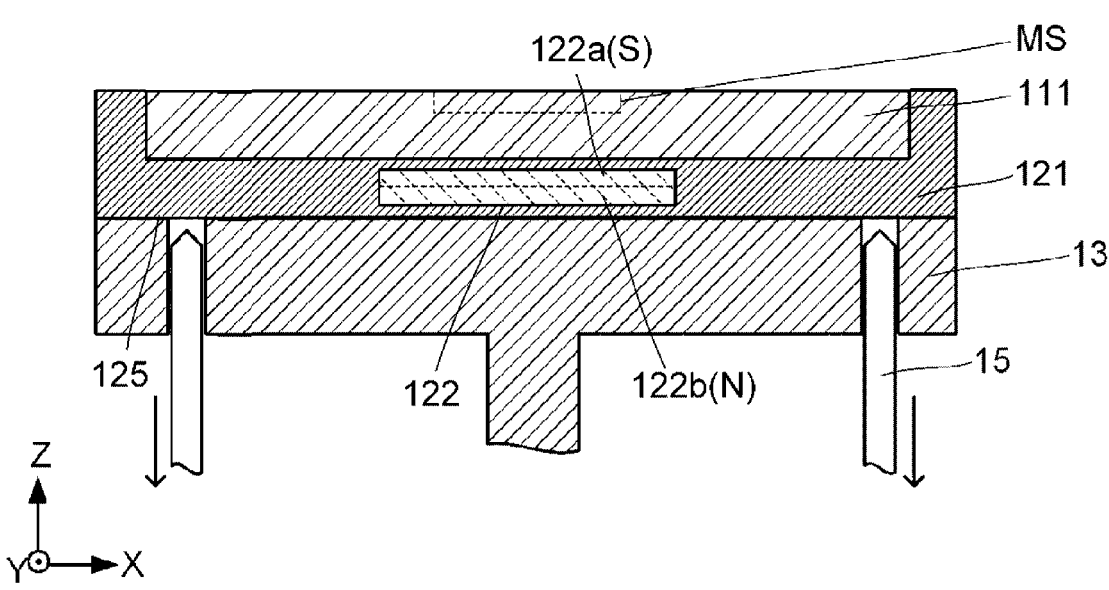
FIG. 16 is a schematic cross-sectional view illustrating an example of the plasma treatment step.

The plasma treatment step S3 is performed in the plasma treatment unit 1 by the following steps. First, as shown in FIG. 14, the structure 102 on which the treatment target 101 has been placed is disposed on the electrode 13 from the coalescence/separation unit 2 via the loading/unloading door 12 by using the robot arm 52. Next, as shown in FIG. 15, the lift 15 is raised by the elevation controller 16, the treatment target 101 and the structure 102 are held by using the lift 15, the robot arm 52 is driven by the conveyance controller 53, and the robot arm 52 returns to the original position thereof. Next, as shown in FIG. 16, the lift 15 is lowered by the elevation driving mechanism 14, and the treatment target 101 and the structure 102 are placed on the surface 13*a* of the electrode 13. At this time, the magnetic body 122 is disposed between the surface 13*a* of the electrode 13 and the treatment target 101, and is placed in the chamber 11 (refer to FIG. 2) to have a single polarity within a plane substantially parallel to the surface 13*a*.

Figure 17:
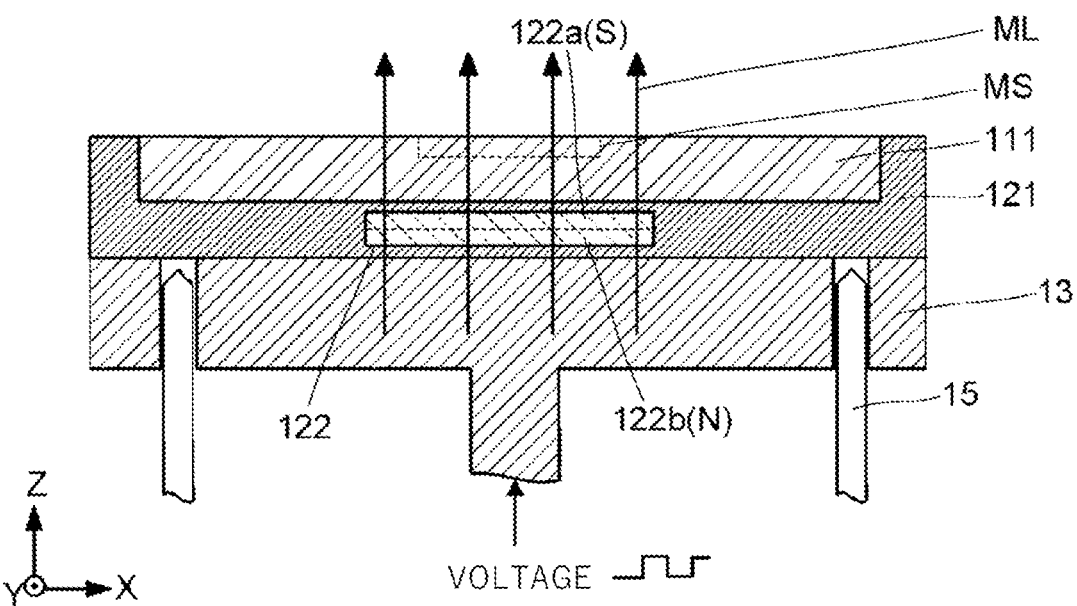
FIG. 17 is a schematic cross-sectional view illustrating an example of the plasma treatment step.

Next, plasma treatment is performed. The gas introduction mechanism 18 is controlled to introduce the raw material gas into the chamber 11, and as shown in FIG. 17, a voltage is applied to the electrode 13 to generate plasma from the raw material gas. Negative ions, positive ions, radicals and the like are generated by plasma conversion of the raw material gas. After the plasma treatment step S3, the raw material gas is discharged from the chamber 11 via the gas discharge mechanism 19. At this time, a magnetic force line ML is formed from the N-pole region 122*b* toward the S-pole region 122*a* in the direction intersecting the surface 13*a* by the magnetic body 122.

By applying a voltage, the electrode 13 alternately repeats, for example, a first potential and a second potential. The first potential is, for example, a positive potential. The second potential is, for example, a negative potential. A voltage such as a pulse voltage or a high frequency voltage may be applied to the electrode 13. The high frequency voltage has, for example, a frequency of 0.3 MHz to 300 MHz, more specifically in some examples, 4 MHz to 13.56 MHz.

When generating plasma, it is preferable that the temperature of the electrode 13 be adjusted by, for example, the temperature control mechanism 20 such that the temperature of the magnetic body 122 is equal to or lower than the Curie temperature. Permanent magnets containing rare earth elements such as neodymium are susceptible to heat damage. Since the plasma used for the film forming treatment serves as a heat source, the characteristics of the magnetic body 122 can be maintained by controlling the temperature of the magnetic body 122. As an example, the Curie temperature of neodymium is approximately 330° C.

The treatment target 101 and the structure 102 after the plasma treatment step S3 are conveyed to the coalescence/separation unit 2 by the conveyance driving mechanism 51 and separated from each other based on the separation information from the control unit 8. The structure 102 is then conveyed to the structure storage unit 4 by the conveyance driving mechanism of the connecting unit 7. The treatment target 101 is then conveyed to the target loading/unloading unit 3 by the conveyance driving mechanism 61, and is unloaded to the outside of the plasma treatment apparatus 100 based on the treatment completion information from the target loading/unloading unit 3 to the control unit 8.

Figure 18:
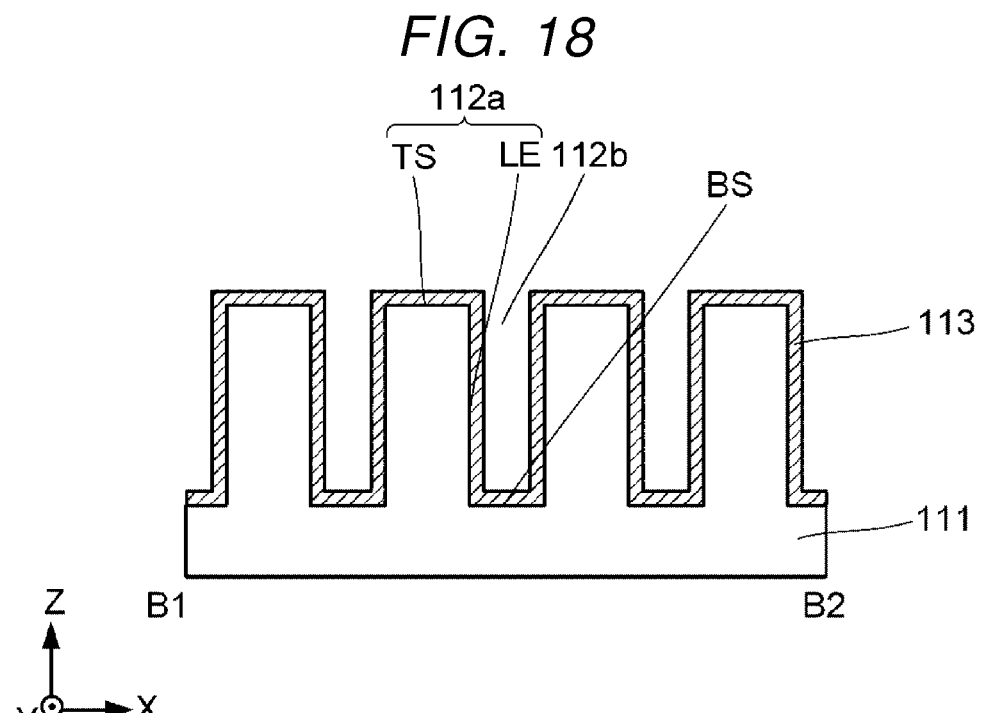
FIG. 18 is a schematic cross-sectional view showing a structural example of a treatment target after the plasma treatment step.

FIG. 18 is a schematic cross-sectional view showing a structural example of the treatment target 101 after the plasma treatment step S3. For the same parts as those in FIG. 6, the description in FIG. 6 can be appropriately incorporated. By the plasma treatment step S3, the film 113 can be formed as shown in FIG. 18. Then, the film 113 may be removed by another step, for example, using oxygen plasma. Accordingly, it is possible to manufacture an original plate (for example, a template) with reduced roughness.

By forming the film 113, carbon, for example, can be embedded in the minute recess portions (not separately depicted) that are on the surface of the base 111. Thus, formation of film 113 can be used to reduce the roughness on the surface of the treatment target 101. In a case of a thin film capable of transmitting light being formed on the treatment target, the film 113 may remain on the surface of the base 111. Alternatively, a part of the film 113 can be removed, and the exposed minute projection portions of the base 111 can be flattened by slimming to reduce the roughness, and then, the film 113 may be completely removed. The film 113 contains, for example, carbon (C). The film 113 may further contain silicon (Si) and oxygen (O). The film 113 may be a compound such as silicon carbide. The film 113 may be a diamond-like carbon (DLC) film.

The silicon carbide of the film 113 can be identified, for example, by checking an electronic state using X-ray electron spectroscopy. The density of the film 113 can be measured, for example, by the X-ray reflectivity method (XRR). The density of silicon carbide is, for example, approximately 3.21 $g/cm^3$. The density of quartz glass is, for example, approximately 2.21 $g/cm^3$. The density of the mixed layer is, for example, approximately 2.25 $g/cm^3$. The thickness of the film 113 is not particularly limited, but is, for example, 3 nm or less in the present example.

The film 113 may contain carbon ions and silicon dioxide. This is because not all carbon ions react with the silicon of the base 111. Therefore, in the film 113, the density of carbon ions may be higher than that of the base 111.

The plasma treatment may be performed by, for example, a plasma ion implantation and film deposition ("PBII & D") method. The PBII & D method performs ion implantation with negative ions and ion deposition with positive ions. In the PBII & D method, for example, approximately 100 V of ion energy per carbon ion is added, depending on the raw material gas. Ion energy affects the strength of ion implantation. The higher the acceleration voltage, the higher the ion energy added, and the carbon ions penetrate deeper into the base 111. The raw material gas contains, for example, a carbon compound (organic compound) such as methane ($CH_4$), acetylene ($C_2H_2$), or toluene ($C_6H_5CH_3$).

When carbon ions are implanted into the base 111, the Si—O bond in the silicon dioxide of quartz is broken, and the silicon and carbon are bonded to form a Si—C bond. Alternatively, carbon is further bonded to oxygen to form a Si—O—C bond. In this manner, the film 113 is formed on the outermost layer of the base 111.

The film 113 may be formed not only by the PBII & D method but by another plasma treatment method. For example, in order to efficiently form the film 113, another method that can ion-implant an active species present at the time of film formation of the film 113 into the surface layer of the base 111 may be used.

Furthermore, the formation mechanism of the film 113 will be described. Here, a case where a carbon-containing film is formed will be described as an example. The cations contained in the plasma when forming the film 113 exhibit either fixing, reflection, or gliding behavior when reaching the surface of the base 111.

Figure 19:
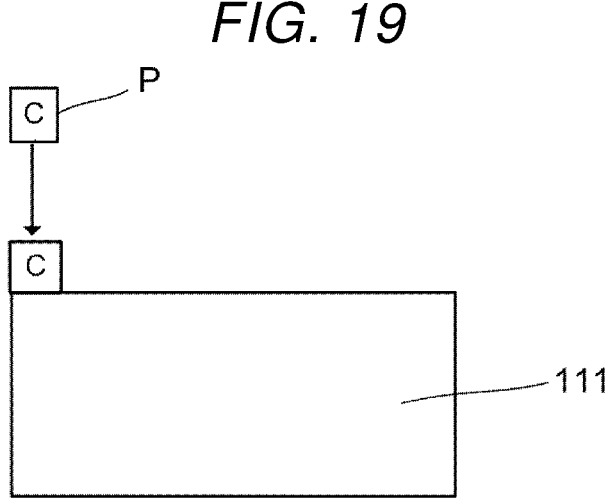
FIG. 19 is a schematic view illustrating a fixing behavior.

FIG. 19 is a schematic view illustrating a fixing behavior. In the fixing behavior, when the cation P reaches the surface of the base 111, the cation P is fixed at the arrival position.

Figure 20:
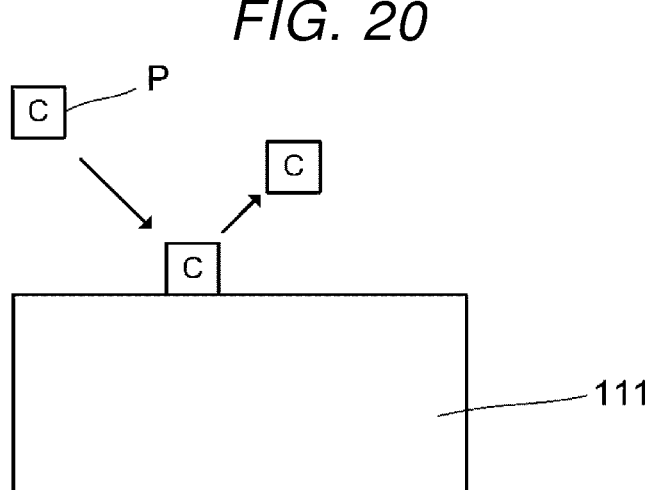
FIG. 20 is a schematic view illustrating a reflection behavior.

FIG. 20 is a schematic view illustrating a reflection behavior. In the reflection behavior, when the cation P reaches the surface of the base 111, the cation P is reflected (bounced). This cation P is not deposited on the surface of the base 111.

Figure 21:
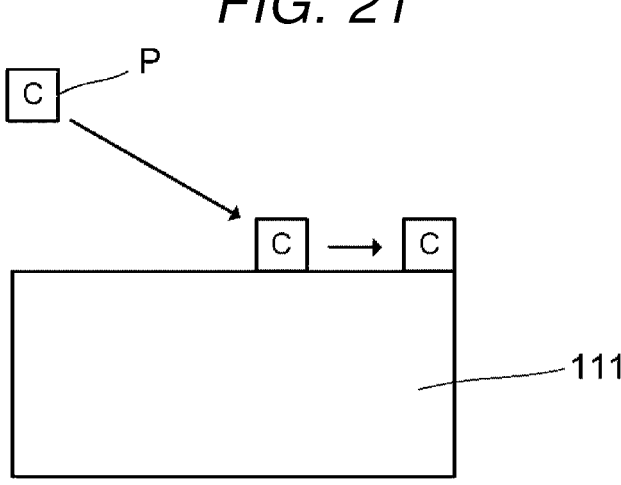
FIG. 21 is a schematic view illustrating a gliding behavior.

FIG. 21 is a schematic view illustrating a gliding behavior. In the gliding behavior, when the cation P reaches the surface of the base 111, the cation P moves along the surface from the impact point.

When the film 113 is formed on the surface of the base 111 having the projection portion 112a and the recess portion 112b as shown in FIG. 6, the roughness reduction effect of the side surface LE tends to be small. The roughness of this side surface LE is also called line edge roughness (LER). It is considered that this is because the trapping force on the side surface LE of the cation P moving due to the gliding behavior is smaller than the trapping force on the upper surface TS. In particular, the larger the aspect ratio of the projection portion 112a, the more remarkable the decrease in the roughness reduction effect tends to be.

On the other hand, in the plasma treatment apparatus and the plasma treatment method of the embodiment, when the plasma treatment is performed, the treatment target 101 and the structure 102 are both placed in the chamber 11 such that the magnetic body 122 is disposed between the surface 13a of the electrode 13 and the treatment target 101 and has a single polarity within a plane substantially parallel to the surface 13a.

Figure 22:
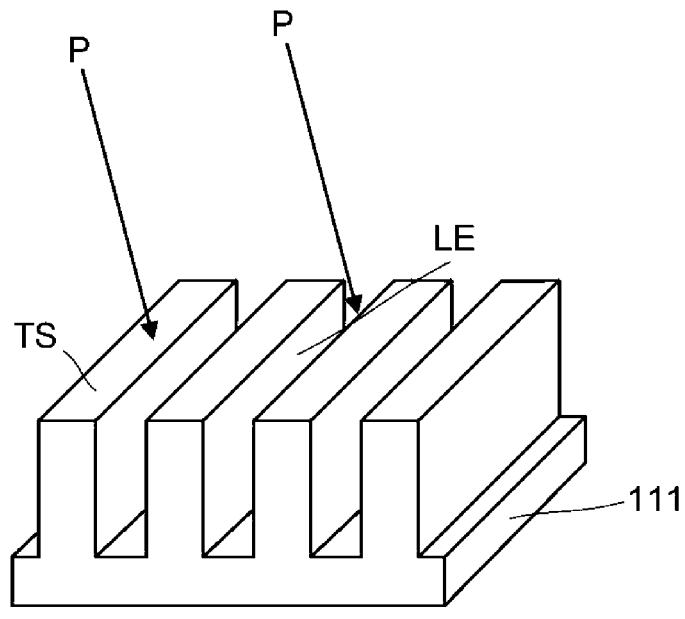
FIG. 22 is a schematic view illustrating a behavior of cations in plasma treatment when a magnetic body is not provided.

FIG. 22 is a schematic view illustrating a behavior of the cations P in plasma treatment when the magnetic body 122 is not provided. When the magnetic body 122 is not provided, the cation P travels in a linear motion and linearly moves along the direction intersecting the upper surface TS of the base 111, as shown in FIG. 22. In this case, since the amount of gliding of the cation P is small, the amount of atoms deposited on the side surface LE is small as compared to the upper surface TS, and thus the roughness reduction effect tends to be small.

Figure 23:
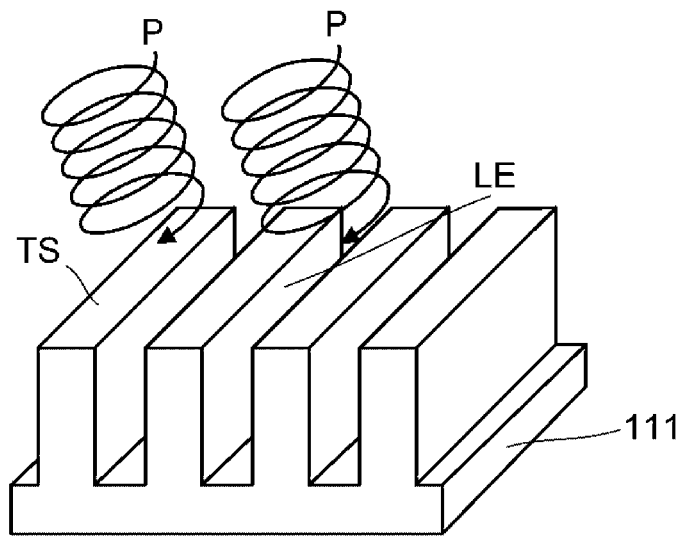
FIG. 23 is a schematic view illustrating a behavior of cations in plasma treatment when the magnetic body is provided.

FIG. 23 is a schematic view illustrating a behavior of the cations P in plasma treatment when the magnetic body 122 is provided. When the magnetic body 122 is provided, the cation P is accelerated in response to a magnetic field based on the magnetic force lines ML. Lorentz force acts on the accelerated cation P. This Lorentz force changes the motion of the cation P into a spiral motion according to Fleming's left-hand rule. In other words, as shown in FIG. 23, the cation P moves in a spiral motion in a spiral shape in a direction intersecting the surface 13a of the electrode 13. In this case, since the amount of gliding of the cation P can be increased as compared with linear motion, the amount of the cation P deposited on the side surface LE can be increased with respect to the upper surface TS. Accordingly, the roughness of the side surface LE can be reduced. It is noted that, since the amount of gliding of the cation P can be increased not only on the side surface LE but also on the upper surface TS, and the roughness reduction effect of the upper surface TS can be enhanced. It is noted that the angular velocity of the spiral motion is proportional to the magnetic flux density of the magnetic body, the higher the magnetic flux density, the greater the spiral motion, and the roughness reduction effect can be enhanced.

Modification Example of Plasma Treatment Apparatus and Plasma Treatment Method

In the description of the plasma treatment step S3 using FIGS. 14 to 17, a case where plasma treatment is performed using the plasma treatment apparatus including an electrode 13 under the treatment target 101 and the structure 102 has been described, but the plasma treatment may be performed using the plasma treatment apparatus 100 including an electrode 13 above the treatment target 101 and the structure 102. The plasma treatment step S3 in the modification example will be described with reference to FIGS. 24 to 27. FIGS. 24 to 27 are schematic cross-sectional views illustrating a modification example of the plasma treatment step S3, and show a part of the X-Z cross section of the treatment target 101. Since the descriptions of the other steps are the same as those in the above embodiment, the descriptions thereof can be appropriately incorporated.

Figure 24:
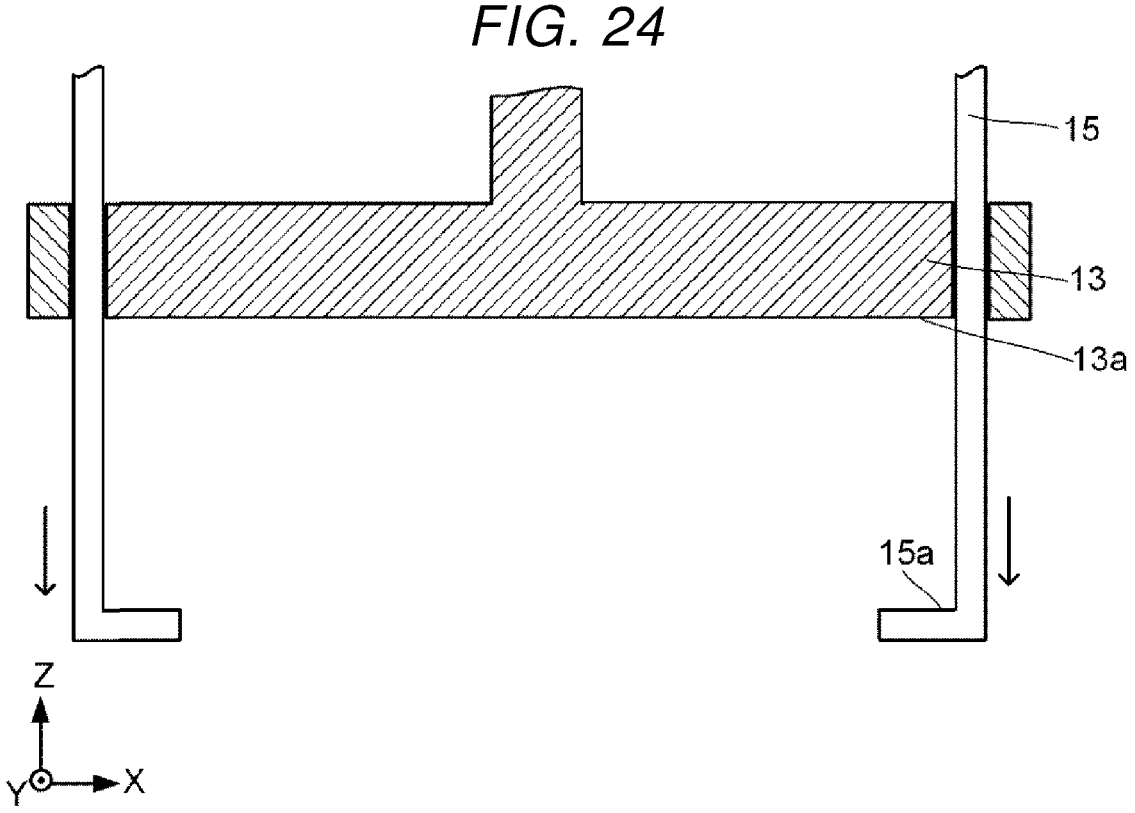
FIG. 24 is a schematic cross-sectional view illustrating a modification example of the plasma treatment step.
Figure 25:
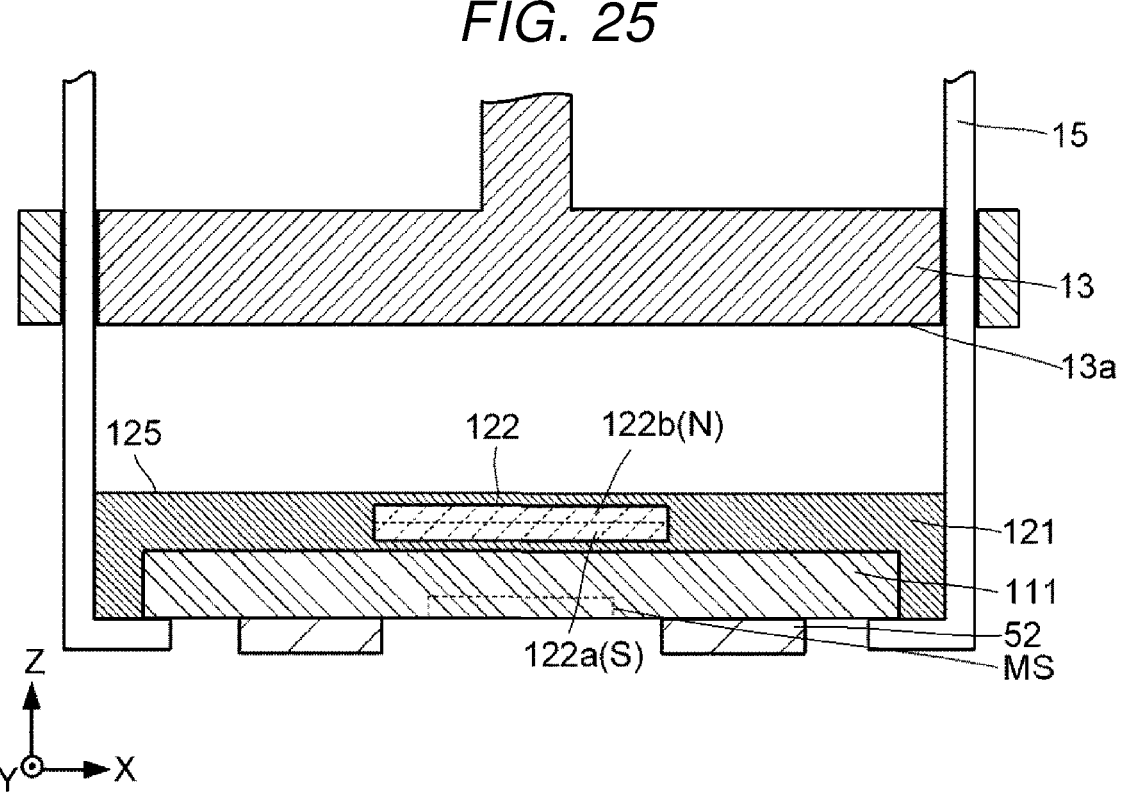
FIG. 25 is a schematic cross-sectional view illustrating a modification example of the plasma treatment step.
Figure 26:
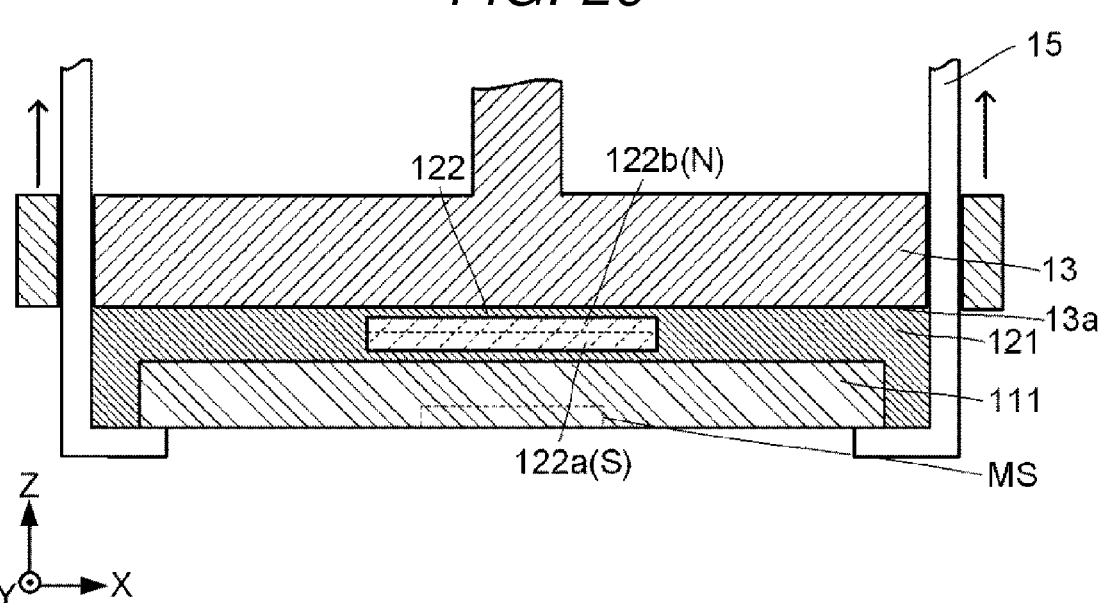
FIG. 26 is a schematic cross-sectional view illustrating a modification example of the plasma treatment step.

The modification example of the plasma treatment step S3 is performed in the plasma treatment unit 1 by the following steps. First, as shown in FIG. 24, the lift 15 is lowered by the elevation controller 16. It is noted that the lift 15 in the modification example of the plasma treatment apparatus 100 has a hold 15a for holding the treatment target 101 and the structure 102. The hold 15a has a function of holding the base 111 together with the tray 121, for example. Next, as shown in FIG. 25, the structure 102 on which the treatment target 101 is placed is disposed on the hold 15a of the lift 15 from the coalescence/separation unit 2 via the loading/unloading door 12 by using the robot arm 52. At this time, the surface of the tray 121 is in contact with the hold 15a. Next, as shown in FIG. 26, the lift 15 is raised by the elevation driving mechanism 14, the treatment target 101 and the structure 102 are held between the lift 15 and the electrode 13, and the treatment target 101 and the structure 102 are placed on the surface 13a of the electrode 13. At this time, the conveyance controller 53 drives the robot arm 52 to return the robot arm 52 to the original position thereof. In addition, the magnetic body 122 is disposed between the surface 13a of the electrode 13 and the treatment target 101, and is placed in the chamber 11 to have a single polarity within a plane substantially parallel to the surface 13a.

Figure 27:
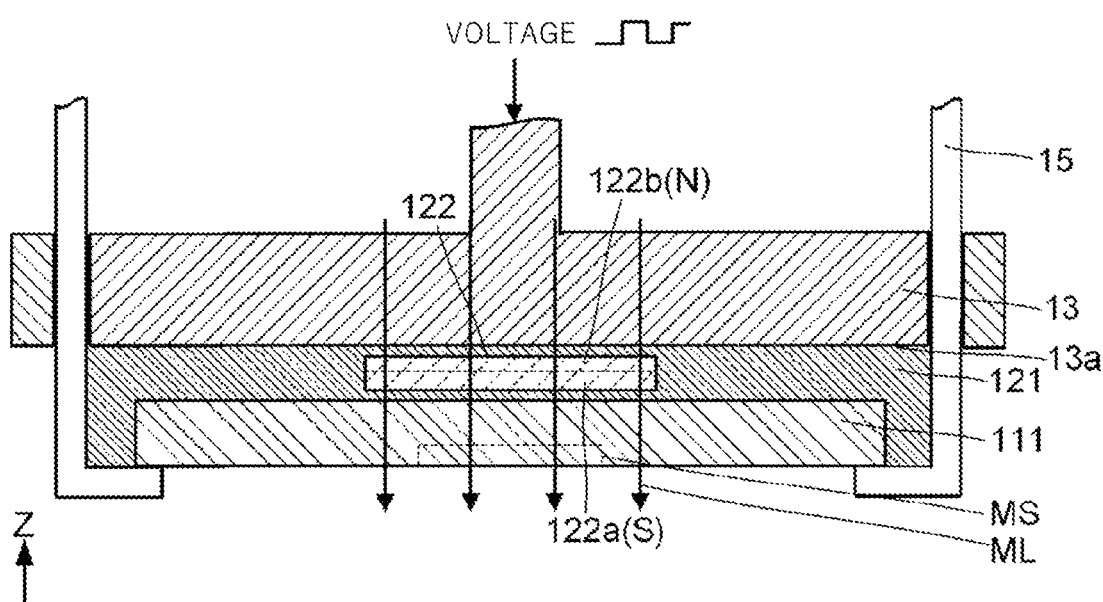
FIG. 27 is a schematic cross-sectional view illustrating a modification example of the plasma treatment step.

Next, the gas introduction mechanism 18 is controlled to introduce the raw material gas into the chamber 11, and as shown in FIG. 27, a voltage is applied to the electrode 13 to generate plasma from the raw material gas and form the film 113. Since other descriptions are the same as those in FIG. 17, the description thereof will be omitted.

When plasma treatment is performed using the plasma treatment apparatus 100 having the electrode 13 above the treatment target 101 and the structure 102, the cation P still performs a spiral motion in the direction intersecting the surface 13a of the electrode 13. In this case, since the amount of gliding of the cation P can be increased as compared with the linear motion, the amount of the cation P deposited on the side surface LE can be increased as compared to the upper surface TS. Accordingly, the roughness of the side surface LE can be reduced. It is noted that, since the amount of gliding of the cation P can be increased not only on the side surface LE but also on the upper surface TS, for example, and the roughness of the upper surface TS can be reduced. It is noted that the higher the magnetic flux density, the greater the spiral motion, and the roughness reduction effect can be enhanced.

It is noted that this embodiment can be appropriately combined with other embodiments.

Second Embodiment

In this second embodiment, other examples of the plasma treatment apparatus and the plasma treatment method will be described.

Plasma Treatment Apparatus

Figure 28:
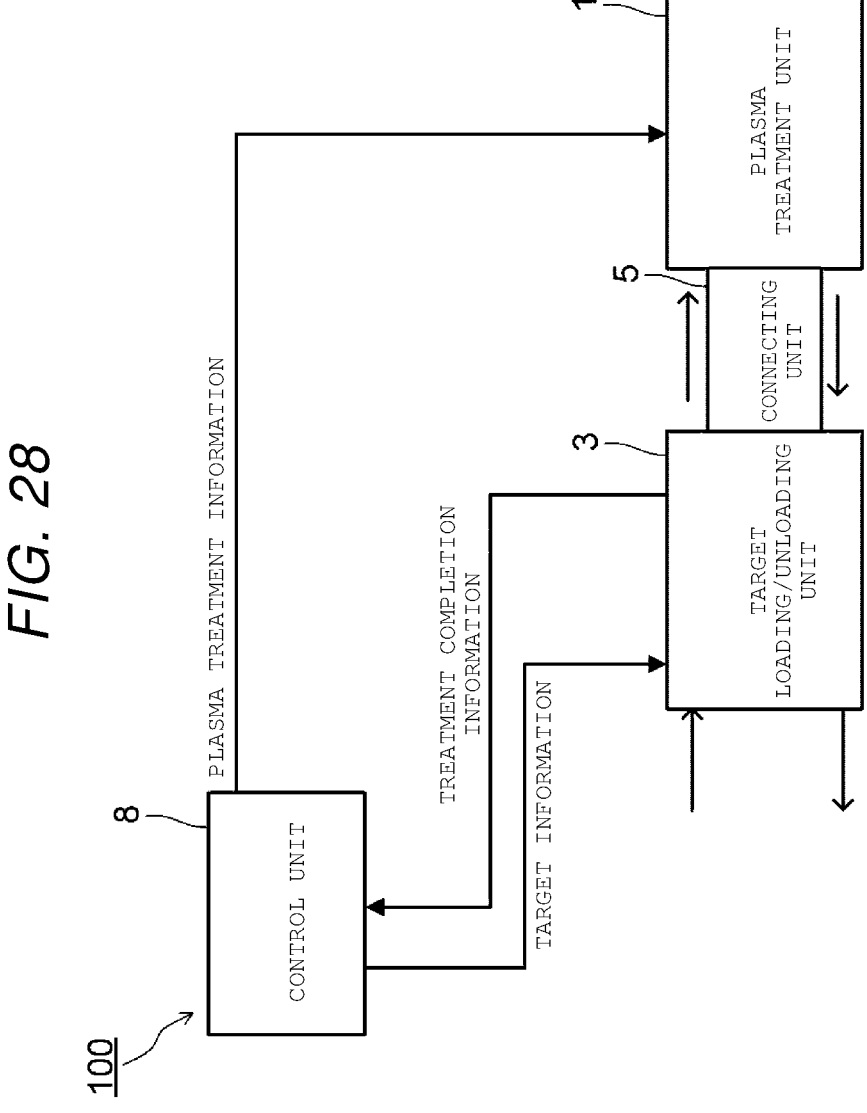
FIG. 28 is a block diagram showing a configuration example of a plasma treatment apparatus of a second embodiment.
Figure 29:
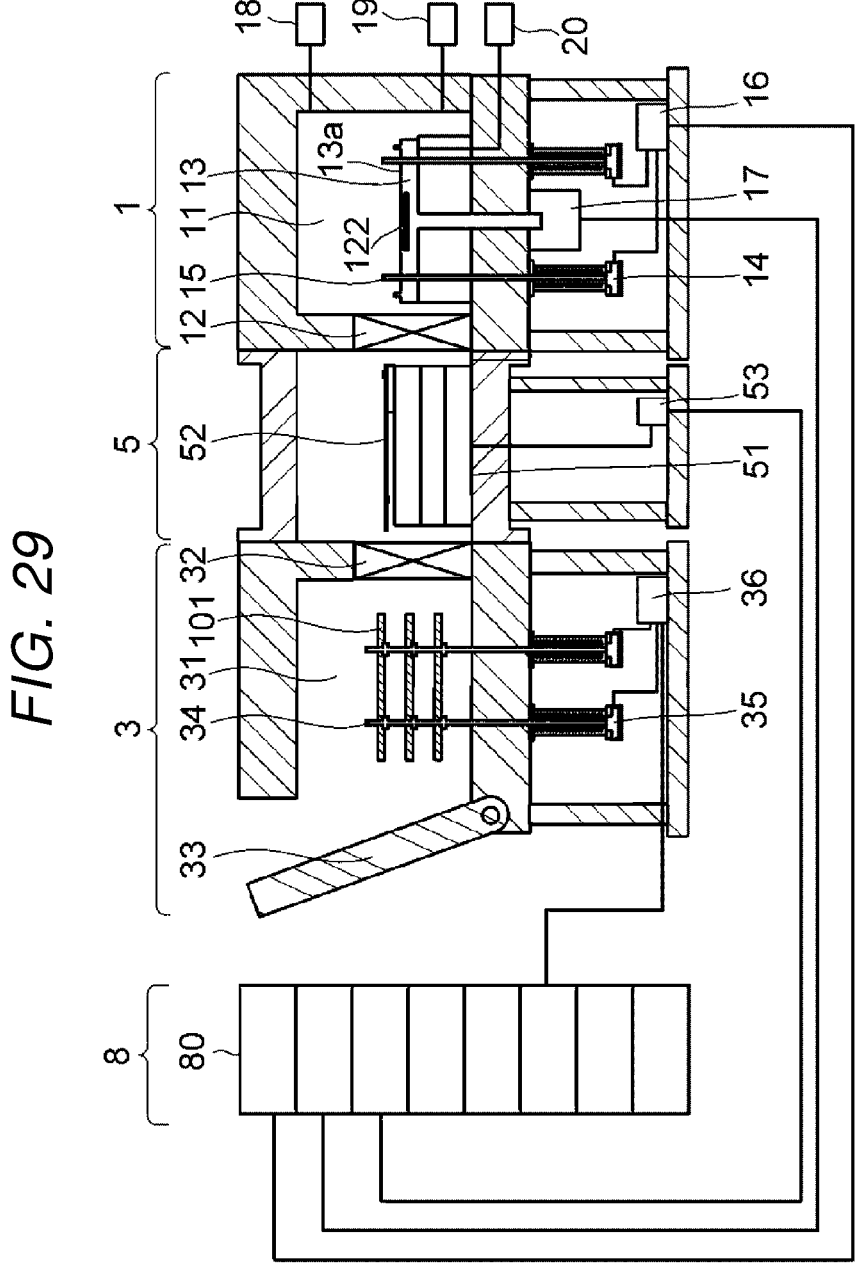
FIG. 29 is a schematic cross-sectional view showing a configuration example of the plasma treatment apparatus of a second embodiment.

FIG. 28 is a block diagram showing a configuration example of the plasma treatment apparatus of a second embodiment. FIG. 29 is a schematic cross-sectional view showing a configuration example of the plasma treatment apparatus of the second embodiment. Here, an example of a plasma CVD apparatus is shown, but the present disclosure is not limited thereto, and a sputtering apparatus or the like may be used.

The plasma treatment apparatus 100 includes a plasma treatment unit 1, a target loading/unloading unit 3, a connecting unit 5, and a control unit 8. The plasma treatment apparatus 100 of the second embodiment does not include a coalescence/separation unit 2, a structure storage unit 4, a connecting unit 6, or a connecting unit 7. The control unit 8 of the second embodiment is also functionally different from the control unit 8 the plasma treatment apparatus 100 of the first embodiment.

Plasma Treatment Unit 1

The plasma treatment unit 1 can perform plasma treatment on the treatment target 101. As shown in FIG. 29, the plasma treatment unit 1 includes a chamber 11, a loading/unloading door 12, an electrode 13, an elevation driving mechanism 14, a lift 15, an elevation controller 16, a voltage controller 17, a gas introduction mechanism 18, a gas discharge mechanism 19, and a temperature control mechanism 20.

The chamber 11 is a space where plasma treatment is performed.

The loading/unloading door 12 connects or disconnects the chamber 11 and the connecting unit 5 by opening and closing.

The electrode 13 is provided in the chamber 11. The electrode 13 has the surface 13a on which the treatment target 101 is placed, and the magnetic body 122 is provided inside the electrode 13. The electrode 13 can generate plasma from the raw material gas introduced into the chamber 11 according to the applied voltage. The voltage of the electrode 13 changes, for example, by alternately applying a positive DC voltage and a negative DC voltage.

In the second embodiment, the magnetic body 122 is embedded in the electrode 13 and superposed on the surface 13a in the Z-axis direction. The magnetic body 122 has the S-pole region 122a facing the surface 13a and the N-pole region 122b on the opposite side from the surface 13a. The magnetic body 122 has a single polarity in a direction parallel to the surface 13a. The magnetic body 122 is, for example, a ferromagnetic body. Examples of ferromagnetic bodies include hard magnetic bodies such as permanent magnets using materials such as ferrite, samarium-cobalt alloys, neodymium, and iron-aluminum-silicon alloys. The number of magnetic bodies 122 is not limited to the number shown in FIG. 29.

The elevation driving mechanism 14 can raise and lower the treatment target 101 by using the lift 15. The elevation driving mechanism 14 is controlled by the elevation controller 16. FIG. 29 shows two elevation driving mechanisms 14, but the number of elevation driving mechanisms 14 is not limited to the number shown in FIG. 29.

The voltage controller 17 has a function of applying a voltage to the electrode 13. The voltage controller 17 includes, for example, a positive DC power source, a negative DC power source, and a power source controller that controls the timing of applying a voltage from these DC power sources.

The gas introduction mechanism 18 can introduce the gas used for plasma treatment into the chamber 11 via a pipe. The gas introduction mechanism 18 includes, for example, a tank for accommodating gas, a pressurizing pump provided in the middle of the pipe connecting the tank and the chamber 11, and a massflow controller that is provided in the middle of the pipe connecting the tank and the chamber 11 to control the flow rate of the gas.

Examples of the gas used for the plasma treatment include a raw material gas for performing film forming treatment on the treatment target 101. The raw material gas contains, for example, a carbon atom.

The gas discharge mechanism 19 can discharge gas from the chamber 11 via the pipe. For example, the inside of the chamber 11 may be controlled to a vacuum state by the gas discharge mechanism 19. The gas discharge mechanism 19 has, for example, the vacuum valve provided in the middle of the pipe connecting the chamber 11 and the outside of the plasma treatment apparatus 100.

The temperature control mechanism 20 can control the temperature of the electrode 13. The temperature control mechanism 20 includes a temperature sensor and at least one of a heater for heating the electrode 13 or a cooler for cooling the electrode 13.

Target Loading/Unloading Unit 3

The target loading/unloading unit 3 can load/unload the treatment target 101. As shown in FIG. 29, the target loading/unloading unit 3 includes a chamber 31, a loading/unloading door 32, a loading/unloading door 33, a cassette 34, an elevation driving mechanism 35, and an elevation controller 36.

The chamber 31 is a space in which the treatment target 101 is stored.

The loading/unloading door 32 connects or disconnects the chamber 31 and the connecting unit 5 by opening and closing.

The loading/unloading door 33 connects or disconnects the chamber 31 and the outside of the plasma treatment apparatus 100 by opening and closing.

The cassette 34 can hold the treatment target 101. FIG. 29 shows an example in which the cassette 34 holds three treatment targets 101, but the number of treatment targets 101 held by the cassette 34 is not limited to the number shown in FIG. 29.

The elevation driving mechanism 35 can raise and lower the cassette 34. The elevation driving mechanism 35 is controlled by the elevation controller 36. FIG. 29 shows two elevation driving mechanisms 35, but the number of elevation driving mechanisms 35 is not limited to the number shown in FIG. 29.

Connecting Unit 5

The connecting unit 5 is provided between the plasma treatment unit 1 and the target loading/unloading unit 3. The connecting unit 5 has a conveyance mechanism including a conveyance driving mechanism 51, a robot arm 52, and a conveyance controller 53.

The conveyance driving mechanism 51 can convey the treatment target 101 between the chamber 11 and the chamber 31 by using the robot arm 52. The operation of the conveyance driving mechanism 51 can be controlled by the conveyance controller 53.

Control Unit 8

The control unit 8 may be implemented by the hardware 80 including, for example, a processor, a personal computer, or the like. The hardware 80 is directly connected to, for example, each of the elevation controller 16, the voltage controller 17, the elevation controller 36, and the conveyance controller 53, or is indirectly connected to each of these via a computer network, and can control each operation by communicating with each of these with information. It is noted that each operation may be stored as an operation program in a non-transitory computer-readable recording medium such as a memory device, and each operation may be executed by appropriately reading the operation program stored in the recording medium by the hardware 80.

Treatment Target 101

The treatment target 101 is, for example, a mold (template) used in a pattern forming method using nanoimprint lithography (NIL). Examples of a template include a master template used as an original plate and a replica template manufactured by using the master template. It is noted that the treatment target 101 is not limited to templates, and may be, for example, a semiconductor substrate. Hereinafter, an example in which a replica template is used for the treatment target 101 will be described, but the present disclosure is not limited thereto.

In the second embodiment, since the magnetic body 122 is disposed inside the electrode 13 of the plasma treatment unit 1, it is not necessary to join the treatment target 101 and a structure 102. Since other descriptions of the treatment target 101 are the same as those of the first embodiment, the description thereof will be omitted.

Plasma Treatment Method

Figure 30:
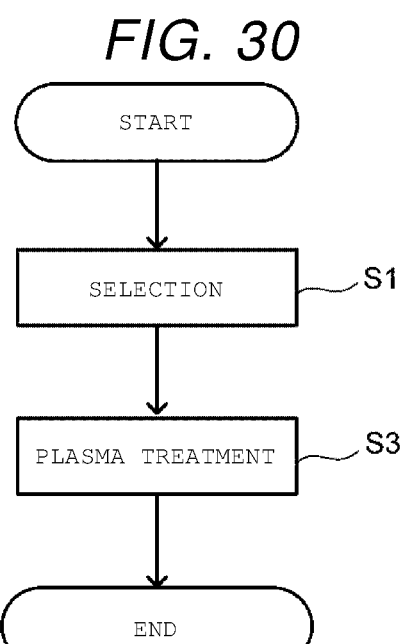
FIG. 30 is a flowchart of an example of the plasma treatment method.

FIG. 30 is a flowchart of an example of the plasma treatment method using the plasma treatment apparatus 100. As shown in FIG. 30, an example of the plasma treatment method includes the selection step S1 and the plasma treatment step S3. The plasma treatment method of the second embodiment does not include the coalescence step S2 of the plasma treatment method of the first embodiment.

Selection Step S1

In the example of the selection step S1, the treatment target 101 in the target loading/unloading unit 3 is selected based on the target information from the control unit 8.

Plasma Treatment Step S3

FIGS. 31 to 34 are schematic cross-sectional views illustrating an example of the plasma treatment step S3, and show a part of the X-Z cross section of the treatment target 101. In the plasma treatment step S3, plasma treatment is performed on the treatment target 101 based on the plasma treatment information from the control unit 8.

Figure 31:
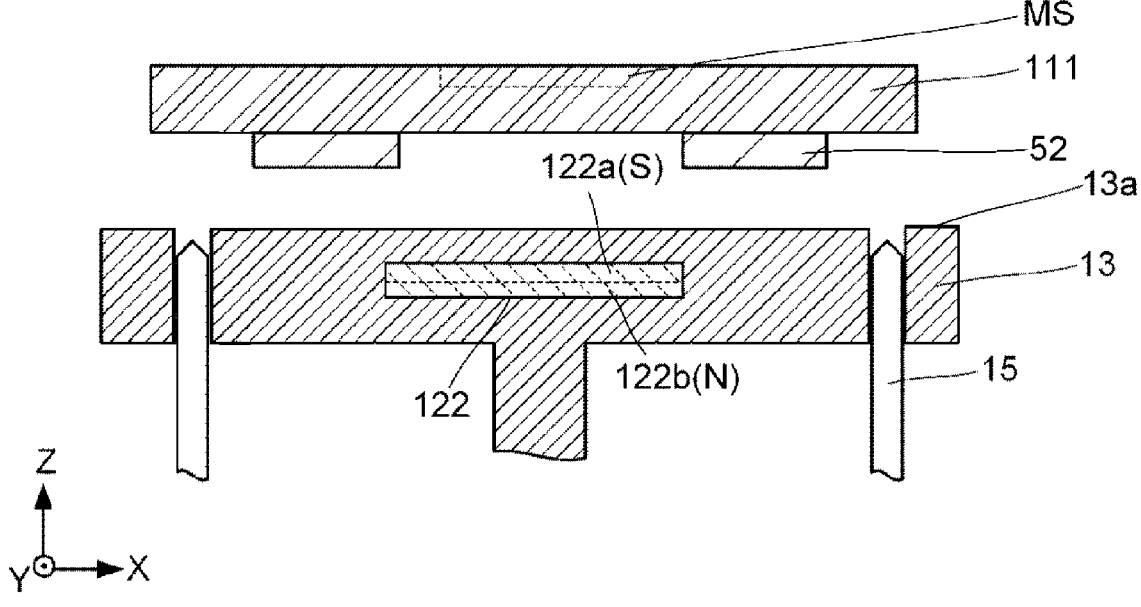
FIG. 31 is a schematic cross-sectional view illustrating an example of the plasma treatment step.
Figure 32:
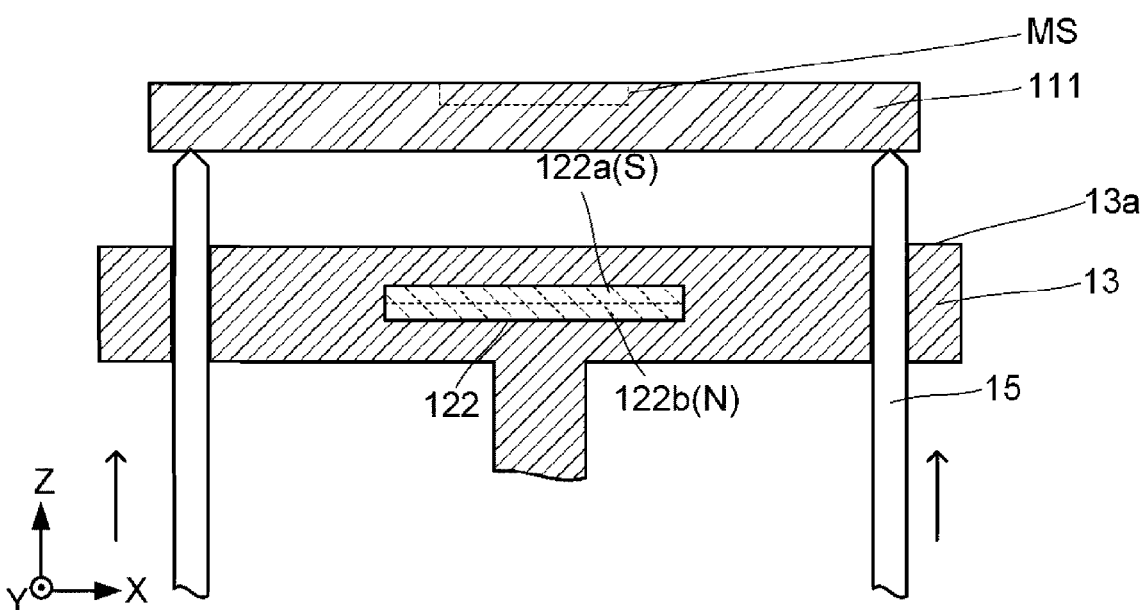
FIG. 32 is a schematic cross-sectional view illustrating an example of the plasma treatment step.
Figure 33:
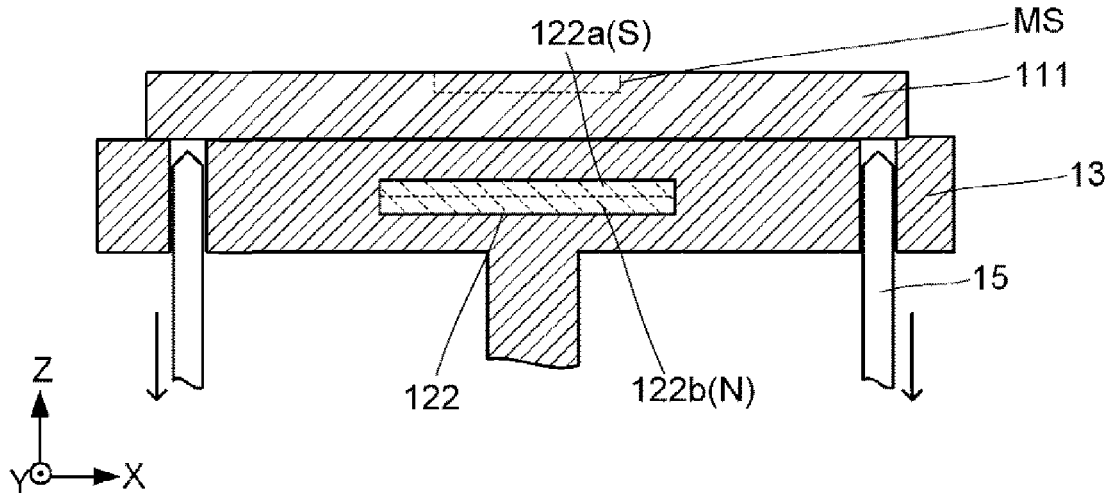
FIG. 33 is a schematic cross-sectional view illustrating an example of the plasma treatment step.

The plasma treatment step S3 is performed in the plasma treatment unit 1 by the following steps. First, as shown in FIG. 31, the treatment target 101 is disposed on the electrode 13 from the target loading/unloading unit 3 via the loading/unloading door 32 by using the robot arm 52. Next, as shown in FIG. 32, the lift 15 is raised by the elevation controller 16, the treatment target 101 is held by using the lift 15, the robot arm 52 is driven by the conveyance controller 53, and the robot arm 52 returns to the original position thereof. Next, as shown in FIG. 33, the lift 15 is lowered by the elevation driving mechanism 14, and the treatment target 101 is placed on the surface 13a of the electrode 13. At this time, the magnetic body 122 is superposed on the surface 13a of the electrode 13 and the treatment target 101.

Figures 34, 35:
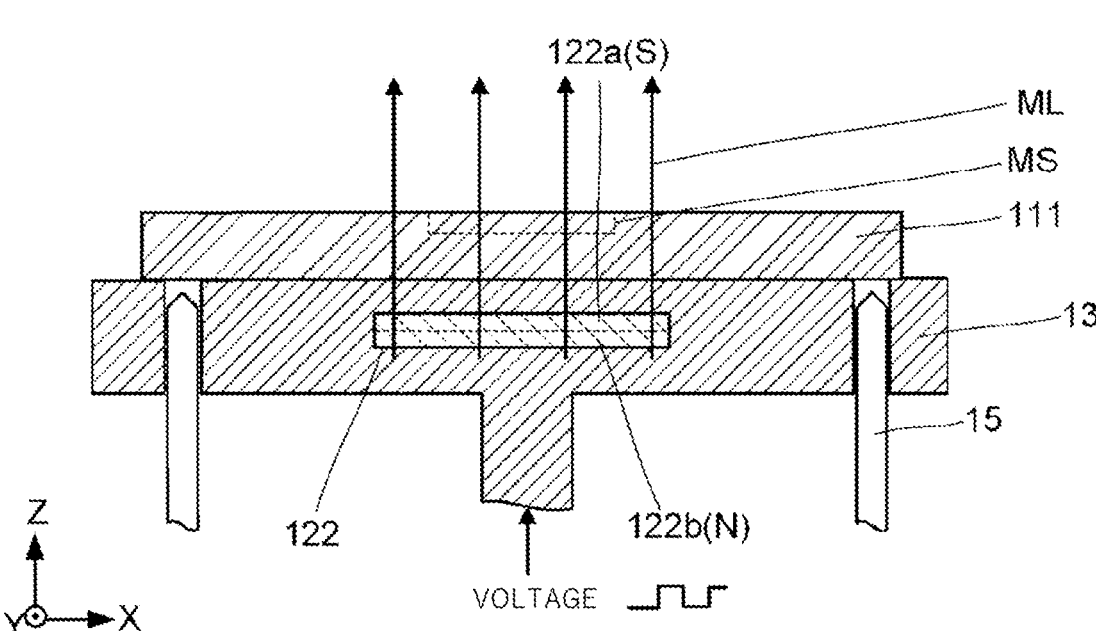
FIG. 34 is a schematic cross-sectional view illustrating an example of the plasma treatment step.
FIG. 35 is a schematic cross-sectional view illustrating a modification example of the plasma treatment step.

Next, the gas introduction mechanism 18 is controlled to introduce the raw material gas into the chamber 11, and as shown in FIG. 34, a voltage is applied to the electrode 13 to generate plasma from the raw material gas. By the plasma treatment step S3, the film 113 can be formed similarly to FIG. 18. Since other descriptions of the film 113 are the same as those of the first embodiment, the description thereof will be omitted.

The film 113 is formed under medium vacuum having an atmospheric pressure of, for example, 0.1 Pa to 100 Pa. At this time, since the treatment target 101 and the structure 102 can be vacuum-conveyed by using the desorption mechanism which is attachable and detachable under vacuum, it is not necessary to open a film forming treatment tank to the atmosphere, and the working time can be shortened.

After the plasma treatment step S3, the raw material gas is discharged from the chamber 11 via the gas discharge mechanism 19. At this time, the magnetic force line ML is formed from the N-pole region 122*b* toward the S-pole region 122*a* in the direction intersecting the surface 13*a* by the magnetic body 122.

By applying a voltage, the electrode 13 alternately repeats, for example, a first potential and a second potential. The first potential is, for example, a positive potential. The second potential is, for example, a negative potential. A voltage such as a pulse voltage or a high frequency voltage may be applied to the electrode 13. The high frequency voltage has, for example, a frequency of 0.3 MHz to 300 MHz, and in one example, 4 MHz to 13.56 MHz.

When generating plasma, it is preferable that the temperature of the electrode 13 be adjusted (maintained) such that the temperature of the magnetic body 122 is equal to or lower than the Curie temperature. Permanent magnets containing rare earth elements such as neodymium are susceptible to heat damage. Since the plasma used for the film forming treatment serves as a heat source, the characteristics of the magnetic body 122 can be maintained by controlling the temperature of the magnetic body 122.

The treatment target 101 after the plasma treatment step S3 is conveyed to the target loading/unloading unit 3 by the conveyance driving mechanism 51, and is unloaded to the outside of the plasma treatment apparatus 100 based on the treatment completion information from the target loading/unloading unit 3 to the control unit 8.

In the plasma treatment apparatus and the plasma treatment method of the second embodiment, when the plasma treatment is performed, the treatment target 101 is placed in the chamber 11 such that the magnetic body 122 is superposed on the surface 13*a* of the electrode 13 and the treatment target 101 and has a single polarity within a plane substantially parallel to the surface 13*a*.

When the magnetic body 122 is provided, the cation P performs a spiral motion in a direction intersecting the surface 13*a* of the electrode 13. In this case, since the amount of gliding of the cation P can be increased as compared with the linear motion, the amount of the cation P deposited on the side surface LE can be increased with respect to the upper surface TS. Accordingly, the roughness of the side surface LE can be reduced. It is noted that, since the amount of gliding of the cation P can be increased not only on the side surface LE but also on the upper surface TS, the roughness of the upper surface TS can also be reduced. It is noted that the higher the magnetic flux density, the greater the spiral motion, and the roughness reduction effect can be enhanced.

Modification Example of Plasma Treatment Apparatus and Plasma Treatment Method

In the description of the plasma treatment step S3 using FIGS. 31 to 34, a case where plasma treatment is performed using the plasma treatment apparatus including an electrode 13 under the treatment target 101 has been described, but the plasma treatment may be performed using a plasma treatment apparatus 100 including an electrode 13 above the treatment target 101. The plasma treatment step S3 in the modification example will be described with reference to FIGS. 35 to 38. FIGS. 35 to 38 are schematic cross-sectional views illustrating a modification example of the plasma treatment step S3, and show a part of the X-Z cross section of the treatment target 101. Since the descriptions of the other steps are the same as those in the above embodiment, the descriptions thereof can be appropriately incorporated.

Figures 36, 37:
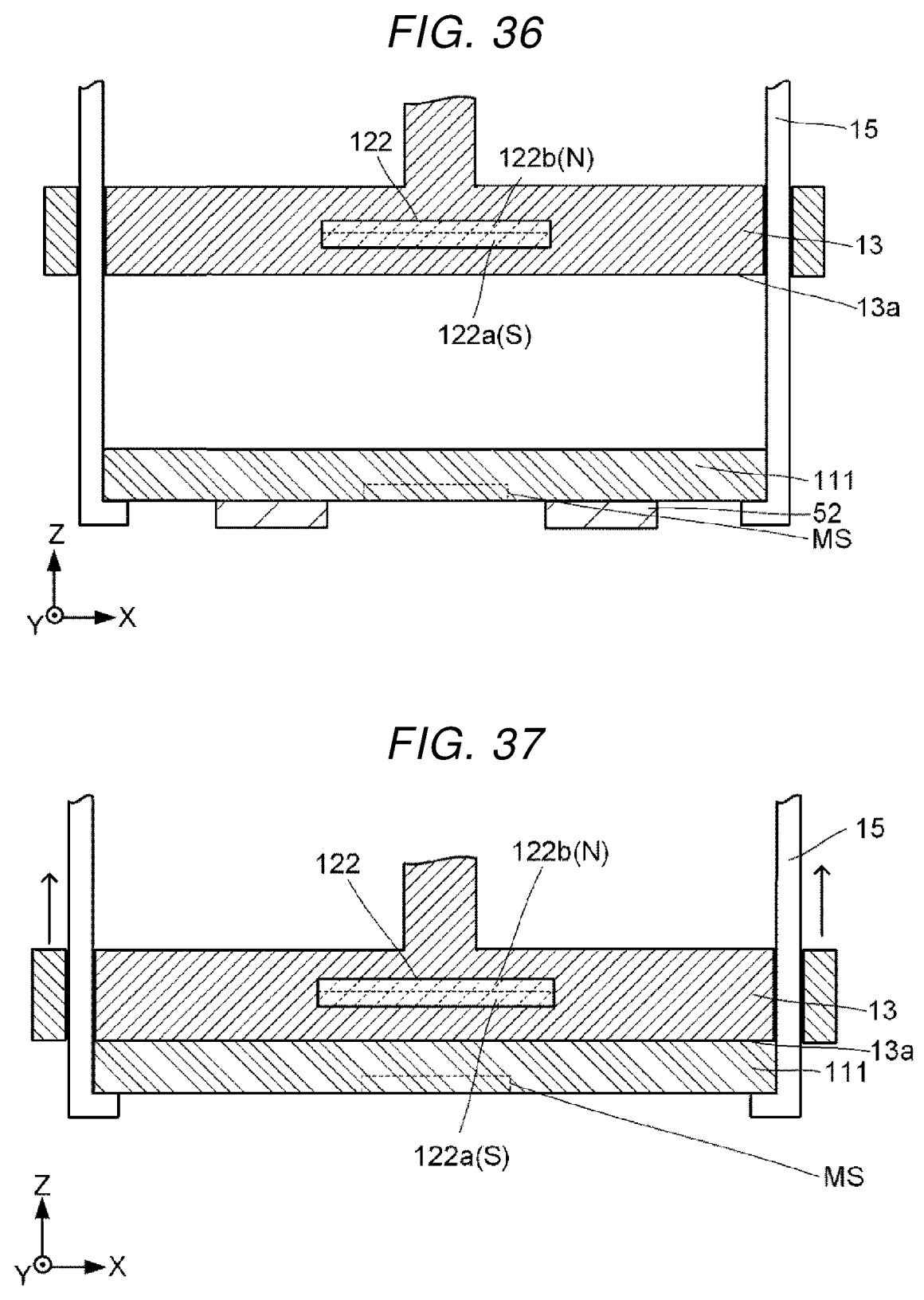

This modification example of the plasma treatment step S3 is performed in the plasma treatment unit 1 by the following steps. First, as shown in FIG. 35, the lift 15 is lowered by the elevation controller 16. It is noted that the lift 15 in this modification example of the plasma treatment apparatus 100 has a hold 15*a* for holding the treatment target 101. The hold 15*a* has a function of holding the base 111, for example. The lift 15 and the elevation controller 16 may have a function as a driving mechanism that controls the distance between the base 111 and the magnetic body 122 on the Z axis. Next, as shown in FIG. 36, the treatment target 101 is disposed on the hold 15*a* of the lift 15 from the target loading/unloading unit 3 via the loading/unloading door 32 by using the robot arm 52. At this time, the surface of the treatment target 101 is in contact with the hold 15*a*. Next, as shown in FIG. 37, the lift 15 is raised by the elevation driving mechanism 14, the treatment target 101 is held between the lift 15 and the electrode 13, and the treatment target 101 is placed on the surface 13*a* of the electrode 13. At this time, the conveyance controller 53 drives the robot arm 52 to return the robot arm 52 to the original position thereof. In addition, the magnetic body 122 is disposed in the chamber 11 to be superposed between the surface 13*a* of the electrode 13 and the treatment target 101, and to have a single polarity within a plane substantially parallel to the surface 13*a*.

Figure 38:
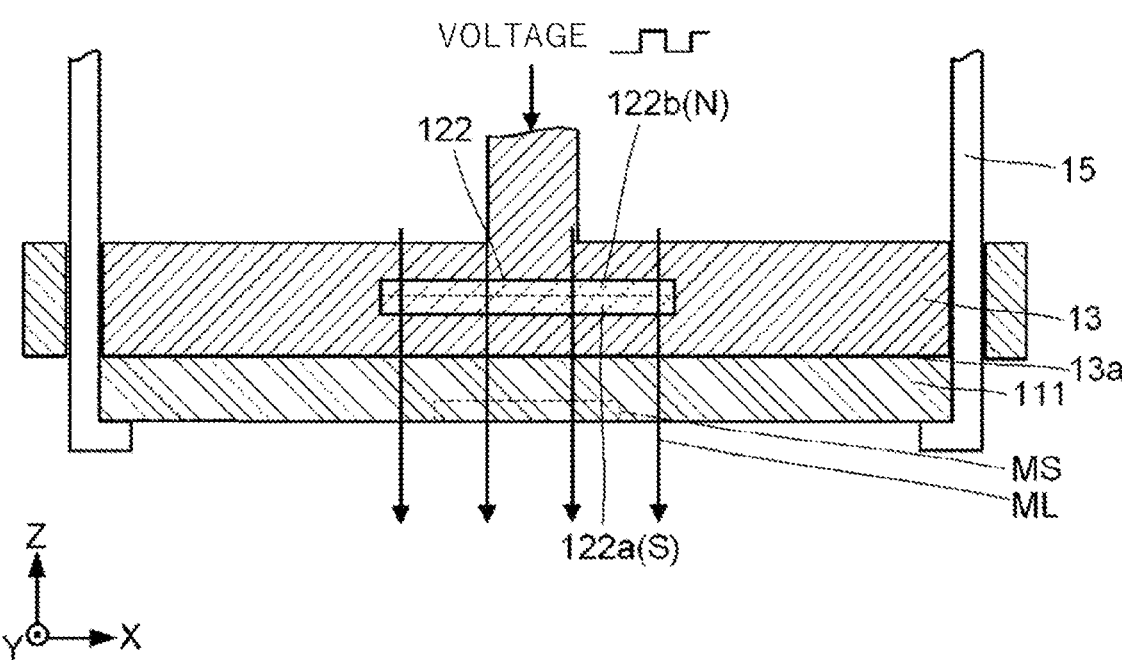
FIG. 38 is a schematic cross-sectional view illustrating a modification example of the plasma treatment step.

Next, the gas introduction mechanism 18 is controlled to introduce the raw material gas into the chamber 11, and as shown in FIG. 38, a voltage is applied to the electrode 13 to generate plasma from the raw material gas and form the film 113. Since other descriptions are the same as those of the first embodiment, the description thereof will be omitted.

When plasma treatment is performed using the plasma treatment apparatus 100 having the electrode 13 above the treatment target 101, the cation P performs a spiral motion in the direction intersecting the surface 13*a* of the electrode 13. In this case, the amount of gliding of the cation P can be increased as compared with the linear motion, thus the amount of the cation P deposited on the side surface LE can be increased with respect to the upper surface TS. Accordingly, the roughness of the side surface LE can be reduced. It is noted that, since the amount of gliding of the cation P can be increased not only on the side surface LE but also on the upper surface TS, and the roughness of the upper surface TS can be reduced. It is noted that the higher the magnetic flux density, the greater the spiral motion, and the roughness reduction effect can be enhanced.

It is noted that, before generating plasma, the lift 15 and the elevation controller 16 change the position of the treatment target 101 with respect to the electrode 13 in the Z-axis direction to adjust the distance between the base 111 and the magnetic body 122 on the Z axis. Since the magnetic flux density due to the magnetic body 122 changes according to the distance between the base 111 and the magnetic body 122, the magnetic flux density can be adjusted by changing the position of the treatment target 101.

It is noted that this embodiment can be appropriately combined with other embodiments.

EXAMPLES

Example 1

In Example 1, in a plasma treatment apparatus of the first embodiment, a film 113 (hereinafter referred to as carbon film) was formed by the plasma treatment method using the plasma treatment apparatus 100 which includes the electrode 13 above the treatment target 101 and the structure 102. A sample of a quartz substrate having a surface having an uneven pattern was used as the treatment target 101, a neodymium permanent magnet was disposed as a ferromagnetic body on the structure 102, and a carbon film was formed on the uneven pattern by the PBII & D method.

Examples 2 and 3

A carbon film was formed under the same conditions as those in Example 1 but the type of the ferromagnetic body disposed on the structure 102 was changed. In Example 2, a ferrite permanent magnet was used, and in Example 3, a samarium-cobalt-based alloy permanent magnet was used.

Figure 39:
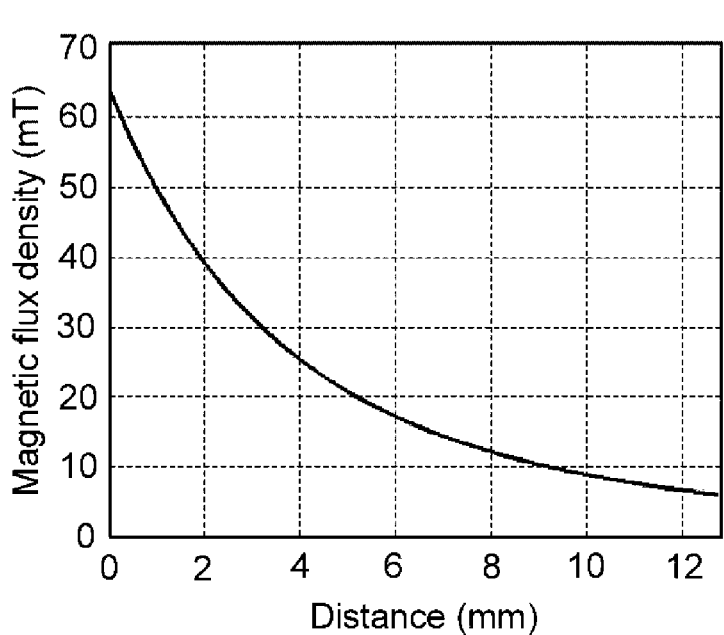
FIG. 39 is a diagram showing a magnetic flux density distribution.

FIG. 39 is a diagram showing a magnetic flux density distribution formed directly above the sample. The calculation conditions for the magnetic flux density distribution are a quartz substrate thickness of 6.4 mm, a magnet radius of 5 mm, a magnet thickness of 4 mm, and a magnet residual magnetization of 1.33 T.

Comparative Example 1

In Comparative Example 1, a carbon film was formed under the same conditions as those in Example 1 except that a permanent magnet was not disposed on the structure 102.

Figure 40:
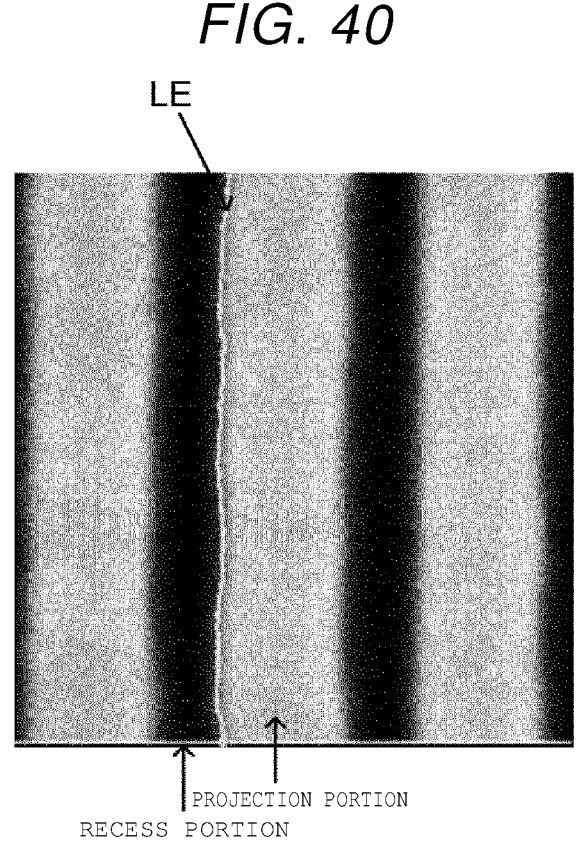
FIG. 40 is a diagram showing an example of a pattern observation image of an electron beam microscope.

In Examples 1, 2, and 3 and Comparative Example 1, the roughness (line edge roughness) of the side surfaces LE on both sides of the projection portion of the pattern after the film formation of the carbon film was evaluated by observing the pattern by using an electron beam microscope. FIG. 40 is a diagram depicting an example of a pattern observation image of an electron beam microscope. This pattern image has a vertical stripe pattern having three line-shaped projection portions and recess portions between these projection portions. The relatively bright parts in FIG. 40 represents a projection portion, and the dark parts represents a recess portion. The width of the recess portion is 20 nm. The boundary between the projection portion and the recess portion corresponds to the side surface LE (line edge). The line edge roughness is the variation of the line edge position expressed by $3\sigma$ (three times the standard deviation).

Figure 41:
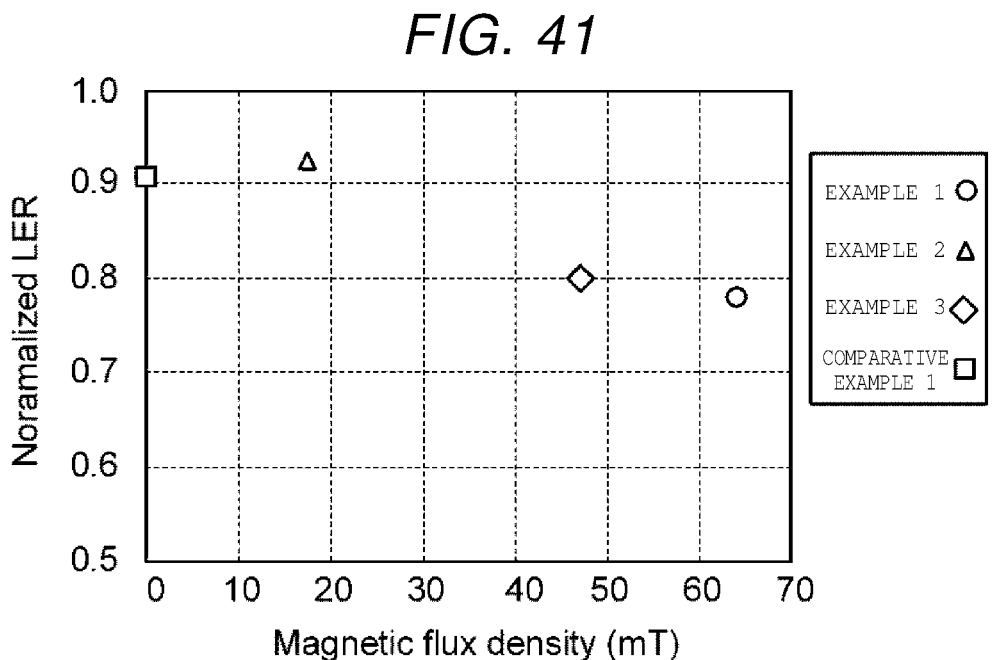
FIG. 41 is a diagram showing the relationship between a magnetic flux density on a sample surface and an LER reduction effect.

FIG. 41 is a diagram showing the relationship between the magnetic flux density on the sample surface and an LER reduction effect. The horizontal axis of FIG. 41 shows the magnetic flux density on the sample surface by the permanent magnet. The vertical axis of FIG. 41 shows a value obtained by dividing the observed LER after the formation of the carbon film by the observed LER before the formation of the carbon film (LER reduction effect, the-smaller-the-better characteristics).

For Comparative Example 1, in which the magnetic body was not used, the magnetic flux density was 0 mT. For Example 1, in which the neodymium permanent magnet was used, the magnetic flux density was 64 mT. For Example 2, in which the ferrite permanent magnet was used, the magnetic flux density was 17 mT. For Example 3, in which the samarium-cobalt-based alloy permanent magnet was used, the magnetic flux density was 47 mT. As can be seen in FIG. 41, the LER reduction effect is improved by providing the permanent magnets in the structure 102. Furthermore, it can be seen in FIG. 41 that, in general, the higher the magnetic flux density, the higher the LER reduction effect. Furthermore, it can be seen that the LER reduction effect is improved for a magnetic flux density of 20 mT or more.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A plasma treatment apparatus, comprising:
a first chamber;
an electrode in the first chamber; and
a conveyance mechanism configured to place a carrier structure holding a treatment target into the first chamber, the carrier structure including a ferromagnetic body that is positioned between the electrode and the treatment target when the carrier structure is placed in the first chamber, wherein
the ferromagnetic body having only a single polarity within a plane substantially parallel to a surface of the electrode at a position between the electrode and treatment target when the carrier structure is placed in the first chamber.

2. The plasma treatment apparatus according to claim 1, further comprising:
a second chamber; and
a stage in the second chamber for joining the carrier structure and the treatment target, wherein
the conveyance mechanism conveys the carrier structure and the treatment target between the first chamber and the second chamber.

3. The plasma treatment apparatus according to claim 1, wherein
the carrier structure comprises a tray having a recess portion into which the treatment target is placed, and
the ferromagnetic body is embedded in the tray at a position superposed on the recess portion.

4. The plasma treatment apparatus according to claim 1, wherein the ferromagnetic body forms magnetic force lines along a direction intersecting the surface during a plasma treatment process in the first chamber.

5. The plasma treatment apparatus according to claim 1, further comprising:
a voltage controller configured to apply a voltage to the electrode.

6. The plasma treatment apparatus according to claim 1, further comprising:
a temperature control mechanism configured to control a temperature of the ferromagnetic body during a plasma treatment process to be a temperature less or equal to a Curie temperature of the ferromagnetic body.

7. The plasma treatment apparatus according to claim 1, further comprising:

a driving mechanism configured to vary a distance between the treatment target and the ferromagnetic body when the treatment target is in the first chamber.

8. The plasma treatment apparatus according to claim 1, wherein the carrier structure is attachable to and detachable from the electrode.

9. The plasma treatment apparatus according to claim 1, wherein the treatment target is a quartz substrate with a patterned surface facing away from the carrier structure.

10. The plasma treatment apparatus according to claim 1, further comprising:

a gas supply pipe for introducing a gas into the first chamber.

11. The plasma treatment apparatus according to claim 1, wherein there is only one ferromagnetic body.

12. The plasma treatment apparatus according to claim 1, wherein the ferromagnetic body is a permanent magnet.

13. A plasma treatment apparatus, comprising:

a first chamber;

an electrode in the first chamber and having a surface;

a ferromagnetic body inside the electrode, the ferromagnetic body having a single polarity within a plane substantially parallel to the surface;

a conveyance mechanism configured to place a treatment target into the first chamber; and a driving mechanism configured to vary a distance between the treatment target and the electrode when the treatment target is in the first chamber, and the driving mechanism configured to attach the treatment target to the electrode.

14. The plasma treatment apparatus according to claim 13, further comprising:

a gas supply pipe for introducing a gas into the first chamber.

15. The plasma treatment apparatus according to claim 13, wherein the electrode is above the treatment target in a plasma treatment process in the first chamber.

16. The plasma treatment apparatus according to claim 13, wherein the electrode is below the treatment target in a plasma treatment process in the first chamber.

17. The plasma treatment apparatus according to claim 1, wherein the ferromagnetic body includes a permanent magnet made of ferrite, samarium-cobalt alloy, neodymium, or iron-aluminum-silicon alloy.

* * * * *